United States Patent
Ishikawa

(10) Patent No.: US 9,476,901 B2
(45) Date of Patent: Oct. 25, 2016

(54) OPTICAL SENSOR

(71) Applicant: MURATA MANUFACTURING CO., LTD., Nagaokakyo-shi, Kyoto-Fu (JP)

(72) Inventor: Hiroto Ishikawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/489,543

(22) Filed: Sep. 18, 2014

(65) Prior Publication Data
US 2015/0006106 A1    Jan. 1, 2015

Related U.S. Application Data

(63) Continuation of application No. PCT/JP2013/056107, filed on Mar. 6, 2013.

(30) Foreign Application Priority Data

Mar. 19, 2012   (JP) ................. 2012-061867

(51) Int. Cl.
*G01P 13/02*    (2006.01)
*G01P 13/04*    (2006.01)
(Continued)

(52) U.S. Cl.
CPC ............... *G01P 13/02* (2013.01); *G01P 13/04* (2013.01); *G01S 17/58* (2013.01); *G06F 3/017* (2013.01); *G06F 3/0304* (2013.01); *H03K 2217/94111* (2013.01)

(58) Field of Classification Search
CPC ...... G01P 13/04; G01P 13/02; G06F 3/0304; G06F 3/017; H03K 2217/94111; G01S 17/58
USPC .......... 702/150; 345/175, 173, 589, 660, 77, 345/158; 347/240, 233; 250/221; 356/28
See application file for complete search history.

(56) References Cited

U.S. PATENT DOCUMENTS 6,078,302 A  *  6/2000  Suzuki ................. G09G 3/3406
                                                            345/102
6,707,027 B2 *  3/2004  Liess ....................... G01P 3/366
                                                            250/221

(Continued)

FOREIGN PATENT DOCUMENTS

CN          1955898 A      5/2007
CN        102346838 A      2/2012
(Continued)

OTHER PUBLICATIONS

Written Opinion and International Search Report issued in PCT/JP2013/056107, mailed on Apr. 23, 2013.
(Continued)

*Primary Examiner* — Carol S Tsai
(74) *Attorney, Agent, or Firm* — Arent Fox LLP

(57) ABSTRACT

Three light emitting elements and one light receiving element are provided on a surface of a substrate. An arithmetic processing portion of a signal processing circuit separates three reflected light signals from a light detection signal from the light receiving element. The arithmetic processing portion calculates a square sum of the difference between the entire waveforms of the reflected light signals while the reflected light signal is shifted. The arithmetic processing portion calculates a phase difference between the reflected light signals on the basis of a shift amount with which the calculated value is minimum. On the basis of similar processing, the arithmetic processing portion calculates a phase difference between the reflected light signals. The arithmetic processing portion identifies a movement direction of a detection object on the basis of the phase differences.

16 Claims, 19 Drawing Sheets

(51) Int. Cl.
*G01S 17/58* (2006.01)
*G06F 3/01* (2006.01)
*G06F 3/03* (2006.01)

(56) References Cited

U.S. PATENT DOCUMENTS

| | | | | |
|---|---|---|---|---|
| 7,439,484 B2* | 10/2008 | Liess | | G06F 3/0421 |
| | | | | 250/221 |
| 7,920,305 B2* | 4/2011 | Ishida | | G06K 15/1219 |
| | | | | 358/474 |
| 8,253,768 B2* | 8/2012 | Ishida | | B41J 2/473 |
| | | | | 347/134 |
| 8,675,008 B2* | 3/2014 | Tsuchikawa | | G06F 3/0304 |
| | | | | 345/207 |
| 8,810,524 B1* | 8/2014 | Rosenberg | | G06F 1/1643 |
| | | | | 345/1.1 |
| 8,942,069 B2* | 1/2015 | Tortora | | G01S 7/481 |
| | | | | 250/221 |
| 2007/0080940 A1* | 4/2007 | Aoki | | G06F 3/0304 |
| | | | | 345/158 |
| 2007/0164201 A1* | 7/2007 | Liess | | G06F 3/0421 |
| | | | | 250/221 |
| 2008/0088893 A1* | 4/2008 | Ishida | | G06K 15/1219 |
| | | | | 358/509 |
| 2010/0295781 A1* | 11/2010 | Alameh | | G06F 3/0346 |
| | | | | 345/158 |
| 2011/0254864 A1* | 10/2011 | Tsuchikawa | | G06F 3/0304 |
| | | | | 345/660 |
| 2012/0019165 A1* | 1/2012 | Igaki | | G08C 17/02 |
| | | | | 315/294 |
| 2012/0044477 A1* | 2/2012 | Han | | B60T 8/172 |
| | | | | 356/28 |
| 2012/0212454 A1* | 8/2012 | Kiyose | | G06F 3/0304 |
| | | | | 345/175 |

FOREIGN PATENT DOCUMENTS

| | | |
|---|---|---|
| JP | 3240941 B2 | 12/2001 |
| JP | 2007-003355 A | 1/2007 |
| JP | 2011-227574 A | 11/2011 |
| WO | WO 2005/076116 A2 | 8/2005 |

OTHER PUBLICATIONS

Silicon Labs AN5802, online, Internet <URL: http://www.silabs.com/pages/DownloadDoc.aspx?FILEURL=Support%20Documents/TechnicalDocs/AN580.pdf&src=DocumentationWebPart>.

* cited by examiner

| f(θ) | AREA A1 (L21>0) | AREA A2 (L21<0) |
|---|---|---|
| f(θ)>f2 | θ=210° | θ=30° |
| f1<f(θ)<f2 | θ=180° | θ=0° |
| 0<f(θ)<f1 | θ=150° | θ=330° |
| (-f1)<f(θ)<0 | θ=120° | θ=300° |
| (-f2)<f(θ)<(-f1) | θ=90° | θ=270° |
| f(θ)<(-f2) | θ=60° | θ=240° |

M

OPTICAL SENSOR

CROSS-REFERENCE TO RELATED APPLICATIONS

The present application is a continuation of PCT/JP2013/056107 filed Mar. 6, 2013, which claims priority to Japanese Patent Application No. 2012-061867, filed Mar. 19, 2012, the entire contents of each of which are incorporated herein by reference.

FIELD OF THE INVENTION

The present invention relates to an optical sensor that detects presence or movement of a detection object by using a light emitting element and a light receiving element.

BACKGROUND OF THE INVENTION

In general, an optical sensor is known which detects movement of a detection object such as a finger or a hand by using a light emitting element and a light receiving element (see, e.g., Patent Document 1 and Non Patent Document 1). Such an optical sensor according to the related art is provided with three light emitting elements surrounding one light receiving element. In the optical sensor, reflected light from a detection object is received for each of the three light emitting elements, and movement of the detection object is detected on the basis of the phase differences among the three reflected lights.

Patent Document 1: Japanese Unexamined Patent Application Publication No. 2011-227574
Non Patent Document 1: "Silicon Labs AN580", [online], Internet <URL: http://www.silabs.com/pages/DownloadDoc.aspx?FILEURL=Support%20Documents/TechnicalDocs/AN580.pdf&src=DocumentationWebPart>

In the optical sensor described in the Patent Document 1, each of rise times at which the three reflected lights become larger than a predetermined threshold or each of fall times at which the three reflected light becomes smaller than a predetermined threshold is detected, and phase differences are obtained on the basis of the time differences among the rise times or the fall times. In the optical sensor described in Non Patent Document 1, each of the peaks of waveforms of the three reflected light is detected, and phase differences are obtained on the basis of the time differences among the peaks. However, in these methods, when waveforms of three currents flowing through a light receiving element are different from each other, it is not possible to accurately obtain phase differences among reflected light, and false detection of a movement direction occurs.

SUMMARY OF THE INVENTION

The present invention has been made in view of the above-described problems, and an object of the present invention is to provide an optical sensor that is able to suppress false detection of a movement direction.

(1) In order to achieve the above-described object, according to the present invention, an optical sensor includes: a substrate, at least three light emitting elements mounted on a surface of the substrate, a light emission controller configured to control light emission operations of the at least three light emitting elements; and at least one light receiving element mounted on the surface of the substrate. Light obtained by reflecting, by a detection object, light emitted from the light emitting elements is received by the light receiving element, thereby detecting presence and movement of the detection object. The optical sensor includes: a reflected light signal obtaining unit configured to obtain three reflected light signals corresponding to the light from the three light emitting elements, on the basis of a light detection signal outputted from the light receiving element when the light obtained by reflecting, by the detection object, the light from the at least three light emitting elements is received by the light receiving element; a phase difference calculator configured to obtain each phase difference on the basis of differences or correlations among entire waveforms of the three reflected light signals; and a movement direction identifying unit configured to identify a movement direction of the detection object on the basis of at least the two phase differences.

According to the present invention, since the at least three light emitting elements are used, for example, when the detection object reflects the light from the three light emitting elements, phase differences among the respective reflected light are detected, whereby it is possible to detect movement in two axis directions parallel to the surface of the substrate. In addition, by detecting the intensities of the reflected light, it is also possible to detect movement in a direction perpendicular to the substrate.

In addition, since the phase difference calculator obtains each phase difference on the basis of the differences or the correlations among the entire waveforms of the three reflected light signals, even when the waveforms of three currents flowing through the light receiving element are different from each other, the phase difference calculator is able to obtain each phase difference in consideration of the differences or the correlations among the entire waveforms of these currents. Thus, it is possible to increase the accuracy of detecting each phase difference, as compared to the case where each phase difference is obtained on the basis of peaks or the like of the reflected light signals. Since the movement direction identifying unit determines the movement direction of the detection object by using the phase differences obtained by the phase difference calculator, it is possible to suppress false detection of a movement direction.

(2) In the present invention, when calculating a phase difference between the two reflected light signals, the phase difference calculator sums, in a state where one of the reflected light signals is temporally shifted by a predetermined shift amount, a square of a difference from the other of the reflected light signals over the entire waveform, and sets a shift amount with which the summed value is minimum, as the phase difference.

According to the present invention, when calculating a phase difference between the two reflected light signals, the phase difference calculator sums, in a state where one of the reflected light signals is temporally shifted by a predetermined shift amount, a square of a difference from the other of the reflected light signals over the entire waveform, and sets a shift amount with which the summed value is minimum, as the phase difference. Thus, it is possible to obtain the phase difference in consideration of the difference between the entire waveforms of the two reflected light signals, and it is possible to increase the accuracy of detecting the phase difference.

(3) In the present invention, when calculating a phase difference between the two reflected light signals, the phase difference calculator performs a product sum calculation of the two reflected light signals in a state where one of the reflected light signals is temporally shifted by a predetermined shift amount, and sets a shift amount with which the calculated value is maximum, as the phase difference.

According to the present invention, when calculating a phase difference between the two reflected light signals, the phase difference calculator performs a product sum calculation of the two reflected light signals in a state where one of the reflected light signals is temporally shifted by a predetermined shift amount, and sets a shift amount with which the calculated value is maximum, as the phase difference. Thus, it is possible to obtain the phase difference in consideration of the mutual correlation between the entire waveforms of the two reflected light signals, and it is possible to increase the accuracy of detecting the phase difference.

(4) In the present invention, the light emission controller causes each of the at least three light emitting elements to emit light by pulse emission in a time-division manner.

According to the present invention, since the light emission controller causes each of the at least three light emitting elements to emit light by pulse emission in a time-division manner, it is possible to detect the reflected light from each light emitting element by means of the one light receiving element. Thus, it is possible to reduce the number of light receiving elements, and it is possible to reduce the number of components and decrease the manufacturing cost.

(5) In the present invention, each of the light emitting elements is a vertical cavity surface emitting laser.

According to the present invention, since each of the light emitting elements is a vertical cavity surface emitting laser, for example, as compared to the case where a light emitting diode is used, it is possible to decrease a light emission angle, and it is possible to increase detection resolution and improve an S/N.

DETAILED DESCRIPTION OF THE PREFERRED EMBODIMENTS

Figure 1:
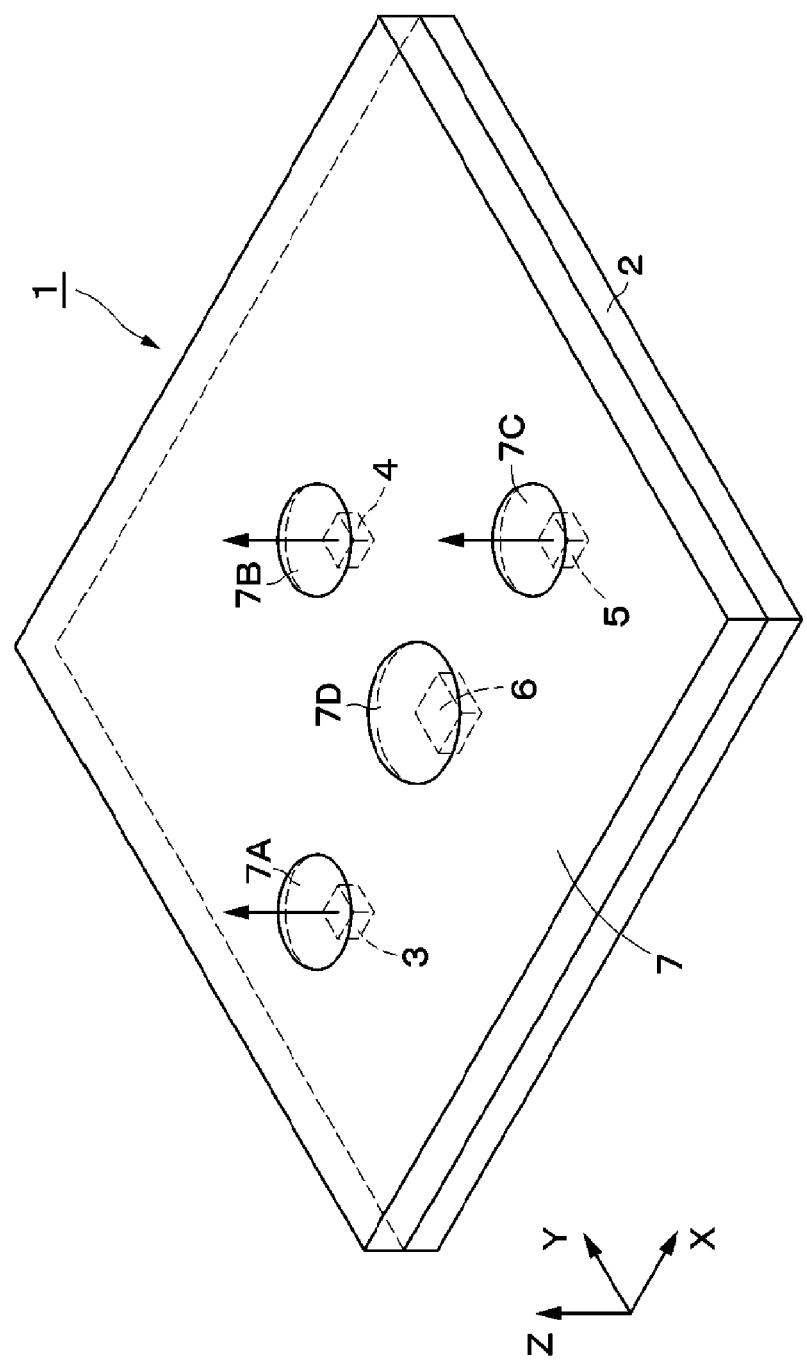
FIG. 1 is a perspective view showing an optical sensor according to a first embodiment.
Figure 2:
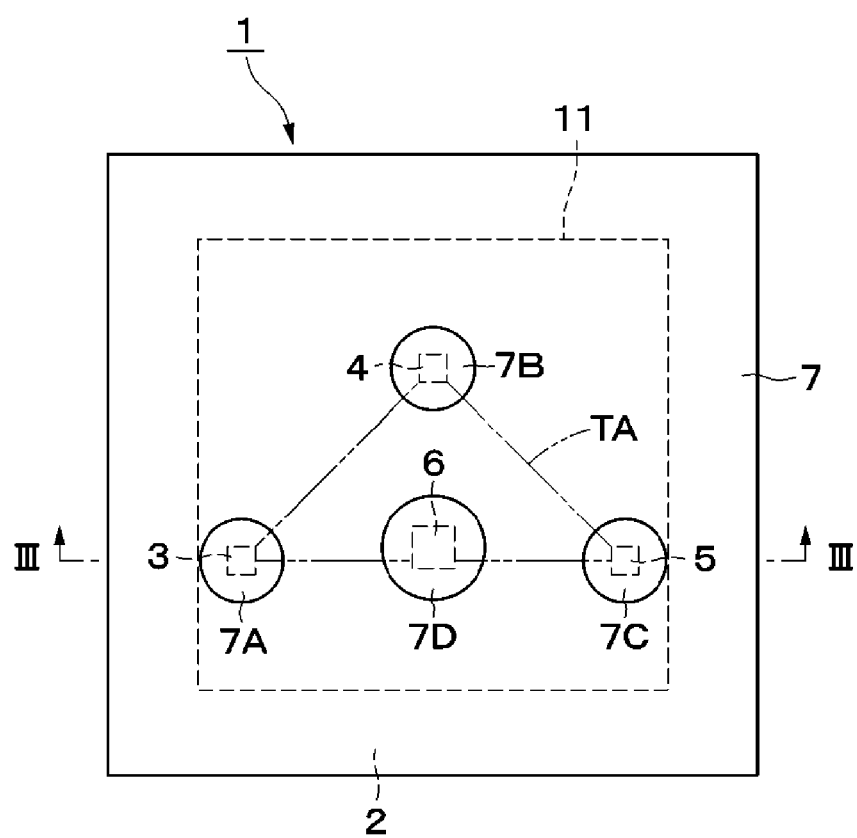
FIG. 2 is a plan view showing the optical sensor in FIG. 1.
Figure 3:
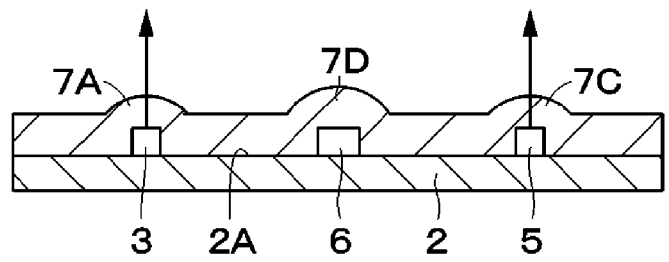
FIG. 3 is a cross-sectional view of the optical sensor as viewed from an arrow III-III direction in FIG. 2.

Hereinafter, optical sensors according to embodiments of the present invention will be described in detail with reference to the drawings.

FIGS. 1 to 4 show an optical sensor 1 according to a first embodiment. The optical sensor 1 includes a substrate 2, light emitting elements 3 to 5, a light receiving element 6, a signal processing circuit 11, and the like.

The substrate 2 is a flat plate formed from an insulating material. For example, a printed wiring board is used as the substrate 2. The light emitting elements 3 to 5 and the light receiving element 6 are mounted on a surface 2A of the substrate 2.

The light emitting elements 3 to 5 are mounted on the surface 2A of the substrate 2 and emit light such as infrared light or visible light. The optical axes of the light emitting elements 3 to 5 generally extend, for example, in a direction perpendicular to the surface 2A of the substrate 2 (in a Z-axis direction). For example, light emitting diodes (LEDs), laser diodes (LDs), or vertical cavity surface emitting lasers (VCSELs) are used as the light emitting elements 3 to 5. In order to increase detection resolution and improve an S/N, VCSELs having originally a small emission angle as elements are preferably used as the light emitting elements 3 to 5.

The three light emitting elements 3 to 5 are disposed on the surface 2A of the substrate 2 so as not to be aligned in a line. Thus, a triangular region TA is formed inside the three light emitting elements 3 to 5 on the surface 2A of the substrate 2.

The light receiving element 6 is mounted on the surface 2A of the substrate 2 and receives infrared light or visible light. For example, a photodiode (PD), a phototransistor, or the like is used as the light receiving element 6. The light receiving element 6 is disposed within the triangular region TA on the surface 2A of the substrate 2. It should be noted that the light receiving element 6 may be disposed outside the triangular region TA.

A transparent resin layer 7 is formed on the surface 2A of the substrate 2. The transparent resin layer 7 covers the entirety of the surface 2A of the substrate 2 and seals the light emitting elements 3 to 5 and the light receiving element 6. In the transparent resin layer 7, light emitting element lenses 7A to 7C are formed at positions corresponding to the respective light emitting elements 3 to 5. The light emitting element lenses 7A to 7C are formed in substantially semispherical shapes projecting upward.

The centers of the light emitting element lenses 7A to 7C coincide with the mounted positions of the light emitting elements 3 to 5. Thus, the optical axes of the light beams from the light emitting elements 3 to 5 extend in the Z-axis direction. It should be noted that the optical axes of the light beams from the light emitting elements 3 to 5 may be inclined relative to the Z-axis direction by displacing the centers of the light emitting element lenses 7A to 7C and the mounted positions of the light emitting elements 3 to 5 relative to each other. In this case, it is preferred to cause the optical axes of the light beams from the light emitting elements 3 to 5 to extend toward outside the triangular region TA such that later-described phase differences T21 and T32 are increased.

In addition, in the transparent resin layer 7, a light receiving element lens 7D is formed at a position corresponding to the light receiving element 6. The light receiving element lens 7D is also formed in a semispherical shape similarly to the light emitting element lenses 7A to 7C. The light receiving element lens 7D condenses externally-incident light on the light receiving element 6.

The light emitting element lenses 7A to 7C and the light receiving element lens 7D are integrally formed in the transparent resin layer 7 which seals the light emitting elements 3 to 5 and the light receiving element 6, but may be provided independently of the transparent resin layer 7.

Next, the signal processing circuit 11 connected to the light emitting elements 3 to 5 and the light receiving element 6 will be described.

Figure 4:
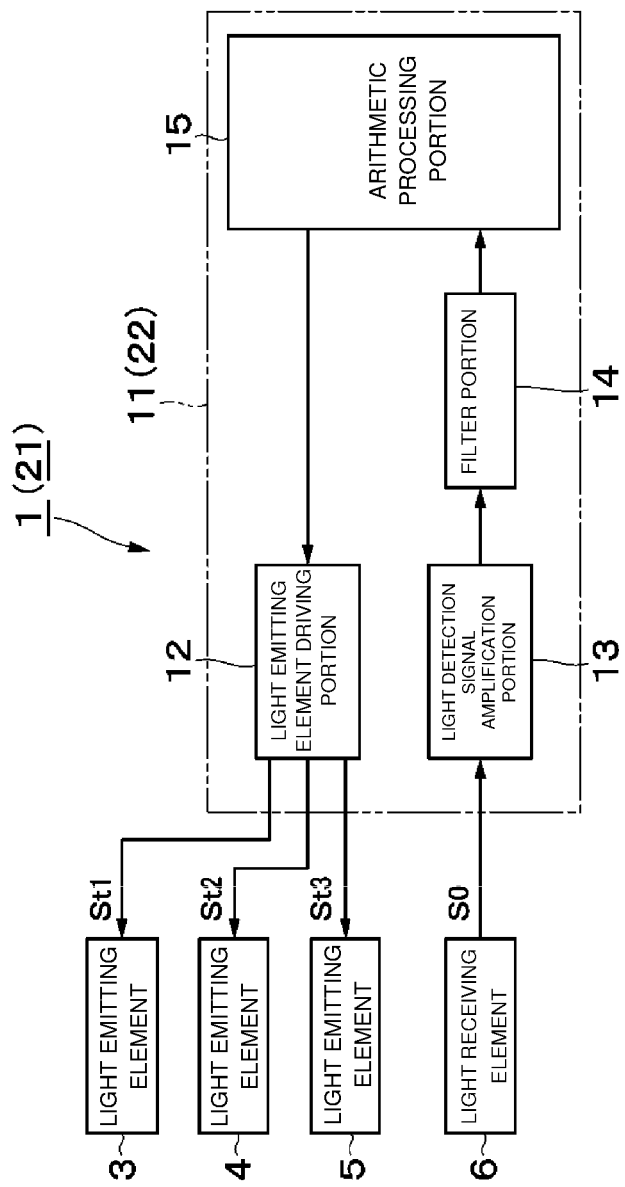
FIG. 4 is a block diagram showing the optical sensor according to the first or second embodiment.

As shown in FIG. 4, the signal processing circuit 11 includes a light emitting element driving portion 12, a light detection signal amplification portion 13, a filter portion 14, and an arithmetic processing portion 15.

The light emitting element driving portion 12 constitutes a light emission controller together with the arithmetic processing portion 15. The light emitting element driving portion 12 is connected to the light emitting elements 3 to 5 and outputs light emission signals St1 to St3 thereto on the basis of a control signal from the arithmetic processing portion 15. Specifically, the light emitting element driving portion 12 supplies driving currents for causing the light emitting elements 3 to 5 to emit light, to the light emitting elements 3 to 5.

The light detection signal amplification portion 13 is connected to the light receiving element 6, performs current-voltage conversion on a light detection signal S0 supplied from the light receiving element 6, and amplifies the light detection signal S0 on which the current-voltage conversion has been performed. The filter portion 14 is connected to a stage subsequent to the light detection signal amplification portion 13 and removes noise from the light detection signal S0 outputted from the light detection signal amplification portion 13.

The signal processing circuit 11 drives the light emitting elements 3 to 5 by using the light emitting element driving portion 12, and outputs the light detection signal S0 corresponding to reflected light from the detection object Obj, to the arithmetic processing portion 15 by using the light detection signal amplification portion 13 and the filter portion 14.

The arithmetic processing portion 15 is, for example, a microprocessor and performs a process of controlling light emission of the light emitting elements 3 to 5, a process of separating three reflected light signals Sr1 to Sr3 corresponding to the light emitting elements 3 to 5, from the light detection signal S0, a process of detecting presence or movement of the detection object Obj on the basis of the three reflected light signals Sr1 to Sr3, overall control of the optical sensor 1, and the like.

Figure 5:
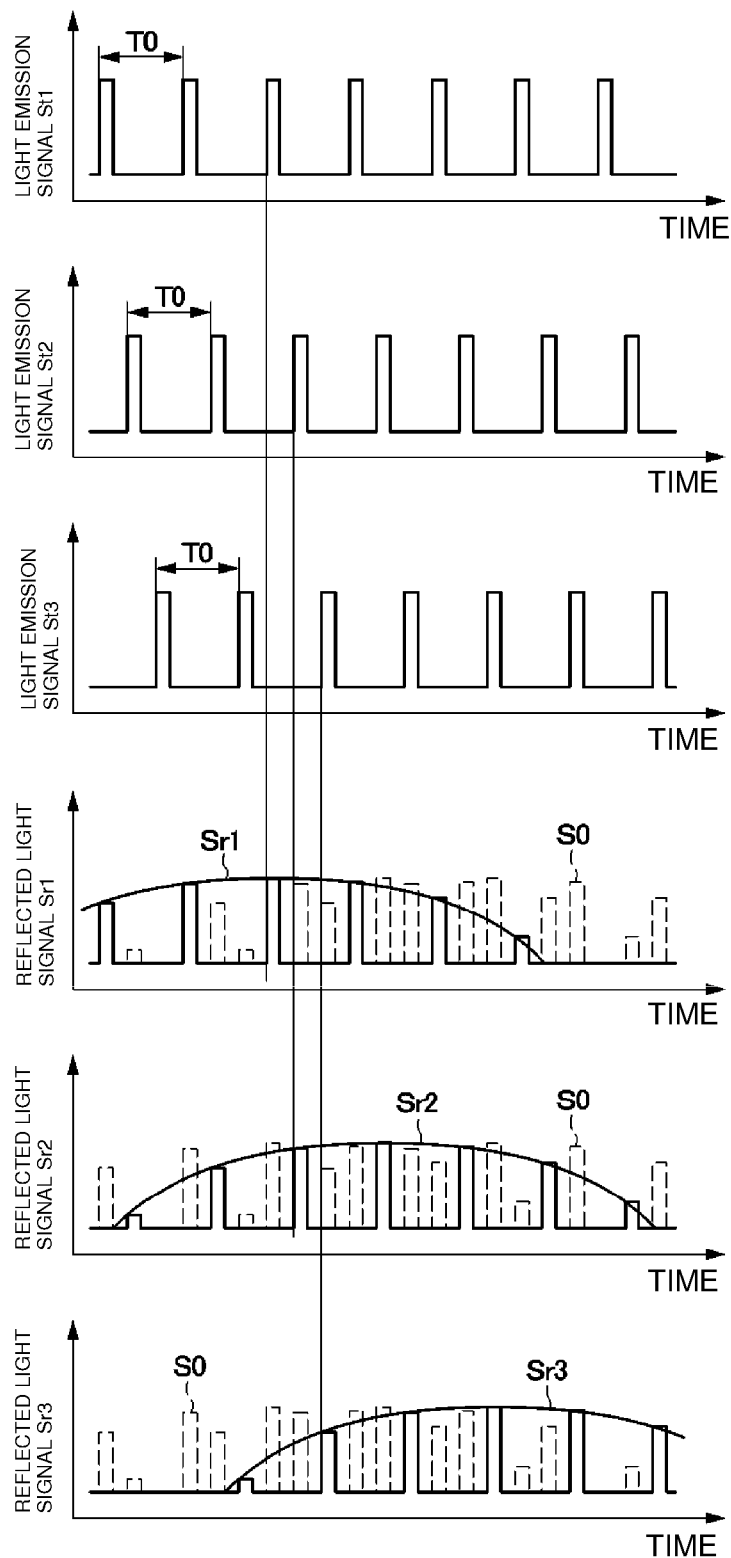
FIG. 5 is a characteristic diagram showing temporal changes of light emission signals and reflected light signals.

Specifically, the arithmetic processing portion 15 supplies a control signal for controlling the intensity of detection light from and the timing of the light emitting elements 3 to 5, to the light emitting element driving portion 12 to cause the light emitting elements 3 to 5 to emit light so as to correspond to the control signal. Here, the light emitting element driving portion 12 supplies pulsed driving currents as the light emission signals St1 to St3 to the light emitting elements 3 to 5, respectively. The pulses of the light emission signals St1 to St3 have a constant emission interval T0 and are outputted at different timings for each of the light emitting elements 3 to 5. Thus, the respective light emitting elements 3 to 5 emit light by pulse emission in a time-division manner (see FIG. 5).

The light emitting elements 3 to 5 may perform pulse emission in a time-division manner. Thus, for example, at the same time as when light emission of the light emitting element 3 is stopped, the next light emission of the light emitting element 4 may be started.

Figure 6:
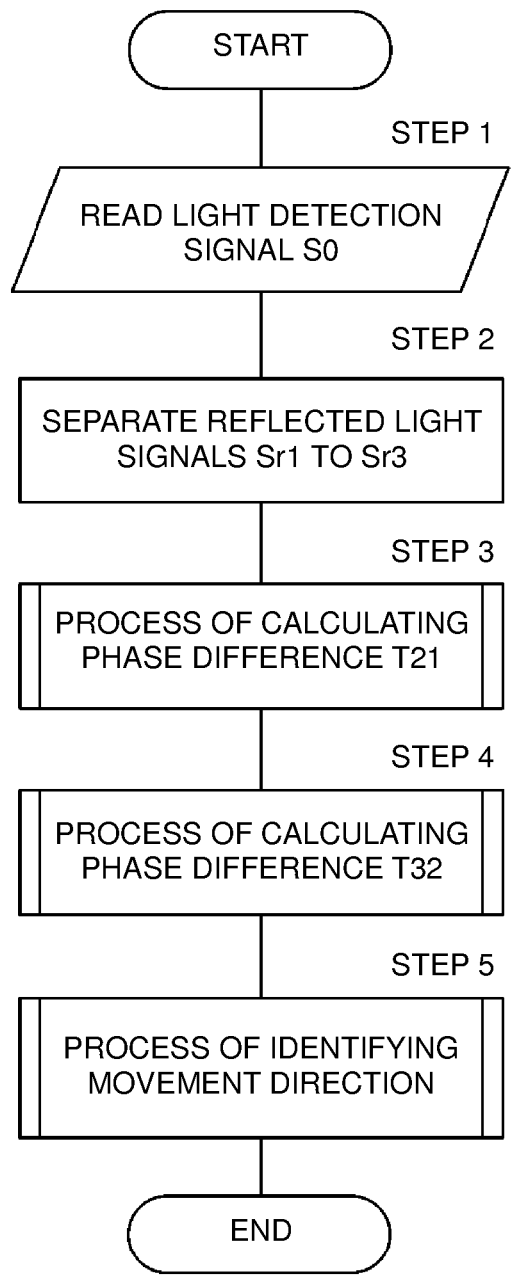
FIG. 6 is a flowchart showing an entire process for identifying a movement direction of a detection object.

In addition, the arithmetic processing portion 15 executes a program shown in FIG. 6. In this program, a movement direction of the detection object Obj is identified by the procedure described below.

In step 1, the arithmetic processing portion 15 reads the light detection signal S0 supplied from the light receiving element 6 via the light detection signal amplification portion 13 and the filter portion 14. In step 2, the arithmetic processing portion 15 separates the three reflected light signals Sr1 to Sr3 from the light detection signal S0.

Here, since the light emitting elements 3 to 5 emit light in a time-division manner at timings different from each other, reflected light obtained by the detection object Obj reflecting the light from each of the light emitting elements 3 to 5 is received at each of the light emission timings of the light emitting elements 3 to 5. Thus, by extracting three signals synchronized with the light emission signals St1 to St3, from the light detection signal S0, it is possible to separate signals of the reflected light based on the light from the respective light emitting elements 3 to 5.

Thus, the arithmetic processing portion 15 extracts the light detection signal S0 at each of the light emission timings of the light emitting elements 3 to 5, and separates the light detection signal S0 into the three reflected light signals Sr1 to Sr3 corresponding to the reflected light of the light emitting elements 3 to 5. At that time, the reflected light signals Sr1 to Sr3 correspond to signals obtained by performing envelope detection on the pulsed light detection signal S0 extracted at each light emission timing.

In this case, by the single light receiving element 6, it is possible to detect the reflected light from the respective light emitting elements 3 to 5. Thus, it is possible to reduce the number of light receiving elements 6, and it is possible to reduce the number of components and decrease the manufacturing cost.

In subsequent step 3, the arithmetic processing portion 15 calculates the phase difference T21 between the reflected light signals Sr1 and Sr2, and in step 4, the arithmetic processing portion 15 calculates the phase difference T32 between the reflected light signals Sr2 and Sr3. At that time, the phase differences T21 and T32 are calculated on the basis of the differences among the entire waveforms of the reflected light signals Sr1 to Sr3. Then, in step 5, the arithmetic processing portion 15 identifies the movement direction of the detection object Obj on the basis of these phase differences T21 and T32.

Next, the process of calculating the phase difference T21 as shown in step 3 in FIG. 6 will be described with reference to FIG. 7.

In step 11, a start time t0 and an end time t1 of the waveform are determined as a range for calculating the differences among the entire waveforms, on the basis of the reflected light signals Sr1 and Sr2. Here, as an example, the case will be described in which a rise time at which the reflected light signal Sr2 becomes larger than a predetermined threshold is set as the start time t0 and a fall time at which the reflected light signal Sr2 becomes smaller than a predetermined threshold is set as the end time t1.

It should be noted that the start time t0 and the end time t1 are not limited to the above, and may be set, for example, at the rise time and the fall time of the reflected light signal Sr1. In addition, the start time t0 and the end time t1 may be set on the basis of one of the reflected light signals Sr1 and Sr2 of which the time difference between the rise time and the fall time is larger, or the start time t0 and the end time t1 may be set on the basis of one of the reflected light signals Sr1 and Sr2 of which the time difference between the rise time and the fall time is smaller. Furthermore, the start time t0 and the end time t1 may be set on the basis of one of the reflected light signals Sr1 and Sr2 of which the rise time is earlier. Moreover, in the case where the size or the movement speed of the detection object Obj is predictable, a time difference between the start time t0 and the end time t1 may previously be set on the basis of the size or the movement speed.

In step 12, a maximum value ($\pm x0$) by which the waveform of the reflected light signal Sr2 is to be shifted to the negative side or the positive side is determined as a detection range of the phase difference T21 on the basis of the reflected light signals Sr1 and Sr2. The maximum value ($\pm x0$) of a shift amount x is set, for example, on the basis of the time difference between the start time t0 and the end time t1 of the waveform of the reflected light signal Sr2. The maximum value ($\pm x0$) of the shift amount may be, for example, a value nearly equal to the time difference between the start time t0 and the end time t1 of the waveform of the reflected light signal Sr2, or may be a value nearly equal to half of the time difference between the start time t0 and the end time t1 of the waveform of the reflected light signal Sr2.

It should be noted that the maximum value ($\pm x0$) of the shift amount may be set at a value smaller or larger than the time difference between the start time t0 and the end time t1 of the waveform of the reflected light signal Sr2. In addition, the maximum value ($\pm x0$) of the shift amount may be set on the basis of the waveform of the reflected light signal Sr1. If the maximum value ($\pm x0$) of the shift amount is experimentally predictable, the maximum value ($\pm x0$) of the shift amount may previously be set at a value based on an experiment.

In step 13, the shift amount x is set at a negative maximum value ($-x0$) as an initial value. In step 14, the reflected light signal Sr2 is temporally shifted by the shift amount x using a function Zd1(x) shown in the following mathematical formula 1, and a square sum of the difference between the reflected light signal Sr2 and the reflected light signal Sr1 is calculated in this state. It should be noted that the function Zd1(x) calculates the sum of discrete values, but the integral of a continuous value may be calculated.

$$Zd1(x) = \sum_{t=t0}^{t1} (Sr2(t-x) - Sr1(t))^2 \qquad \text{[Math. 1]}$$

In subsequent step 15, the shift amount x is increased by a predetermined value $\Delta x$ ($\Delta x > 0$), and in step 16, it is determined whether the shift amount x is larger than a positive maximum value ($+x0$). The predetermined value $\Delta x$ corresponds to an interval at which the phase difference T21 is detected, and is set at a value smaller than the maximum value ($+x0$).

Then, if it is determined as "NO" in step 16, the processes in steps 14 and 15 are repeated. On the other hand, if it is determined as "YES" in step 16, since the shift amount x is larger than the positive maximum value ($+x0$), the process proceeds to step 17, and a shift amount x21 with which the function Zd1(x) is minimum is outputted as the phase difference T21.

Next, a process of calculating the phase difference T32 as shown in step 4 in FIG. 6 will be described with reference to FIG. 8.

Steps 21 to 27 for the process of calculating the phase difference T32 are substantially the same as steps 11 to 17 for the process of calculating the phase difference T21. Thus, in step 21, a start time t0 and an end time t1 of the waveform are determined as a range for calculating the difference between the entire waveforms, on the basis of the reflected light signals Sr2 and Sr3. In step 22, a maximum value ($\pm x0$) by which the waveform of the reflected light signal Sr2 is to be shifted to the negative side or the positive side is determined as a detection range of the phase difference T32 on the basis of the reflected light signals Sr2 and Sr3. In steps 21 and 22, for example, the times t0 and t1 and the maximum value ($\pm x0$) of a shift amount x that are the same values as those in steps 11 and 12 are set.

In step 23, the shift amount x is set at a negative maximum value ($-x0$) as an initial value. In step 24, the reflected light signal Sr3 is temporally shifted by the shift amount x using a function Zd2(x) shown in the following mathematical formula 2, and a square sum of the difference between the reflected light signal Sr3 and the reflected light signal Sr2 is calculated in this state. It should be noted that the function Zd2(x) calculates the sum of discrete values, but the integral of a continuous value may be calculated.

$$Zd2(x) = \sum_{t=t0}^{t1} (Sr3(t-x) - Sr2(t))^2 \quad \text{[Math. 2]}$$

In subsequent step 25, the shift amount x is increased by a predetermined value Δx (Δx>0), and in step 26, it is determined whether the shift amount x is larger than a positive maximum value (+x0). Then, if it is determined as "NO" in step 26, the processes in steps 24 and 25 are repeated. On the other hand, if it is determined as "YES" in step 26, the process proceeds to step 27, and a shift amount x32 with which the function Zd2(x) is minimum is outputted as the phase difference T32.

It should be noted that in order to increase the precision of the phase differences T21 and T32, the time difference between the start time t0 and the end time t1 as the range of the waveform and the maximum value (±x0) that is the range of the shift amount x may be set as large as possible, and the predetermined value Δx may be set as small as possible. However, an increase in calculation amount or a decrease in processing speed occurs as the range of the waveform and the range of the shift amount x are increased and the predetermined value Δx is decreased. Thus, in a range where the precision of the phase differences T21 and T32 is acceptable, the range of an integral and the range of the shift amount x are set as small as possible, and the predetermined value Δx is set as large as possible.

Next, a process of identifying the movement direction as shown in step 5 in FIG. 6 will be described with reference to FIGS. 9 to 12.

In step 31, the ratio f(θ) between the phase difference T21 and the phase difference T32 is obtained on the basis of an equation in the following mathematical formula 3.

$$f(\theta) = \frac{T32}{T31} \quad \text{[Math. 3]}$$

Figures 11, 12:
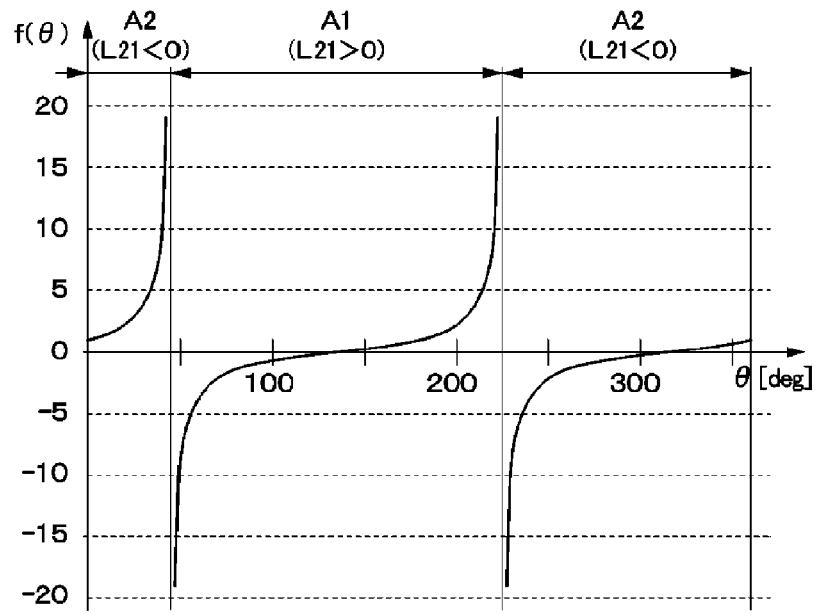
FIG. 11 is an explanatory diagram showing a relationship between the ratio of the two phase differences and the angle of the optical sensor.
FIG. 12 is an explanatory diagram showing a map for identifying the angle of the optical sensor on the basis of the ratio of the two phase differences.

In subsequent step 32, the movement direction of the detection object Obj is identified by applying the ratio f(θ) between the phase differences T21 and T32 to a map M shown in FIG. 12.

Figure 10:
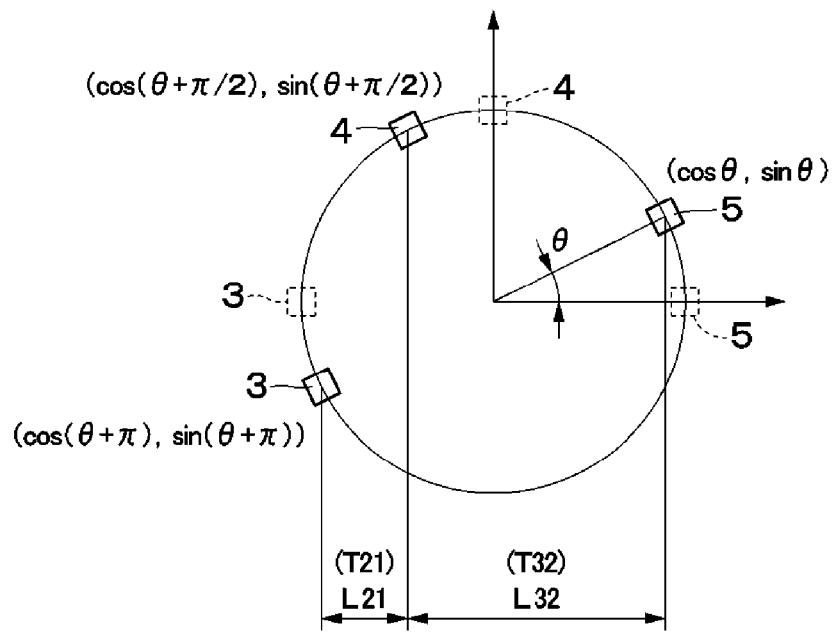
FIG. 10 is an explanatory diagram showing a relationship between the two phase differences and an angle of the optical sensor.

Here, a specific method for creating the map M will be described. The case will be considered in which as shown in FIG. 10, for example, when the light emitting elements 3 to 5 are disposed on the circumference of a circle and a position at the right side of the center of the circumference of the circle is 0°, the light emitting element 3 is disposed at a position of 180°, the light emitting element 4 is disposed at a position of 90°, and the light emitting element 5 is disposed at a position of 0°. It is assumed that the movement speed of the detection object Obj is uniform, the detection object Obj moves in a 0° direction, and an angle (rotation angle) when the optical sensor 1 is rotated is θ. When the angle θ is changed, the distance L21 between the light emitting elements 3 and 4 and the distance L32 between the light emitting elements 4 and 5 in the 0° direction are geometrically changed. In addition, when it is assumed that the detection object Obj moves at a uniform speed, it is possible to estimate distances La and Lb from a time required when the detection object Obj moves (the phase differences T21 and T32).

In this case, the ratio between the distances L21 and L32 agrees with the ratio f(θ) shown in the equation in the mathematical formula 3, and becomes a function with the angle θ being geometrically a variable as shown in the following mathematical formula 4.

$$f = (\theta) = \frac{T32}{T21} = \frac{L32}{L21} = \frac{-\cos(\theta) - \sin(\theta)}{-\cos(\theta) + \sin(\theta)} \quad \text{[Math. 4]}$$

When a relationship between the ratio f(θ) and the angle θ is illustrated, the relationship is as shown in FIG. 11. If a classification is made into a case where the distance L21 is positive (L21>0) and a case where the distance L21 is negative (L21<0), the angle θ and the ratio f(θ) correspond to each other in a one-to-one relation. Therefore, it is possible to obtain the angle θ that is the movement direction of the detection object Obj, on the basis of the ratio f(θ).

For simplification, the map M shown in FIG. 12 is a map in which the angle θ is obtained at an interval of 30° in the range of the ratio f(θ). Here, a first threshold f1 at the positive side is the ratio f(θ) in the case where the angle θ is 165° or 345°, and a first threshold (−f1) at the negative side is the ratio f(θ) in the case where the angle θ is 105° or 285°. In addition, a second threshold f2 at the positive side is the ratio f(θ) in the case where the angle θ is 15° or 195°, and a second threshold (−f2) at the negative side is the ratio f(θ) in the case where the angle θ is 75° or 255°.

In the above, the case where the light emitting elements 3 to 5 are disposed at predetermined angle positions on the circumference of the circle has been described as an example, but these angle positions may be set as appropriate. In addition, the light emitting elements 3 to 5 do not necessarily need to be disposed on the circumference of the circle, and may be disposed at any positions on the substrate 2. Furthermore, the angle θ may be directly calculated backward using the equation in the mathematical formula 4 without using the map M.

Next, a detection operation of detecting the detection object Obj by the optical sensor 1 will be described with reference to FIGS. 13 to 19.

When the optical sensor 1 is driven, the light emitting elements 3 to 5 emit light toward above the substrate 2. When the detection object Obj such as a hand or a finger passes through above the substrate 2 in this state, the optical paths of the light emitting elements 3 to 5 are blocked by the detection object Obj. Thus, the detection object Obj reflects the light from the light emitting elements 3 to 5. The reflected light is received by the light receiving element 6, and the light receiving element 6 outputs a current corresponding to the intensity of the reflected light, as the light detection signal S0.

The arithmetic processing portion 15 separates the three reflected light signals Sr1 to Sr3 from the light detection signal S0 from the light receiving element 6, and calculates the phase differences T21 and T32 among them. Then, the arithmetic processing portion 15 identifies the movement direction, the position, the movement speed, or the like of the detection object Obj on the basis of the two phase differences T21 and T32.

Figure 13:
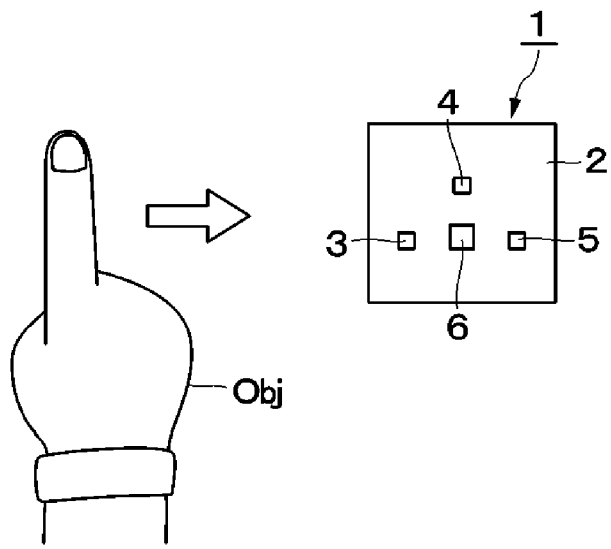
FIG. 13 is an explanatory diagram showing a state where the detection object is moved in an X-axis direction.
Figure 14:
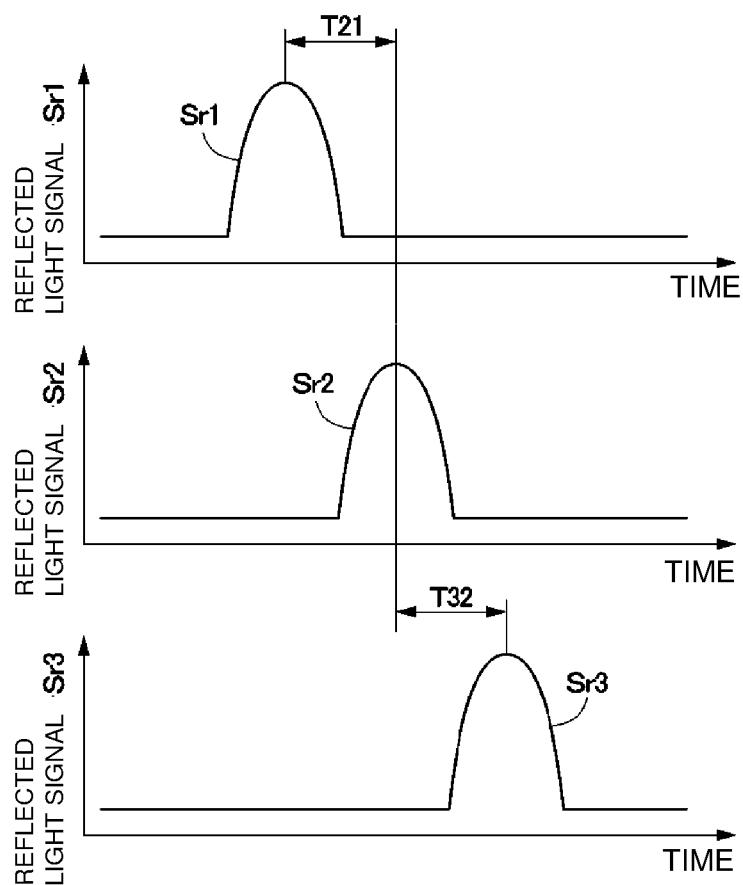
FIG. 14 is a characteristic diagram showing temporal changes of reflected light signals when the detection object is moved in the X-axis direction.

The method for identifying the movement direction or the like is as follows. Here, a description will be given with a finger as an example of the detection object Obj. As shown in FIGS. 13 and 14, when the detection object Obj moves along the X-axis direction, the detection object Obj passes through above the light emitting elements 3, 4, and 5 in this order. Thus, peaks of the reflected light signals Sr1, Sr2, and Sr3 occur in this order, and hence the phase differences T21 and T32 also become values corresponding to such an order of occurrence of peaks. As a result, it is possible to detect movement of the detection object Obj along the X-axis direction and the movement speed of the detection object Obj on the basis of the phase differences T21 and T32.

Figure 15:
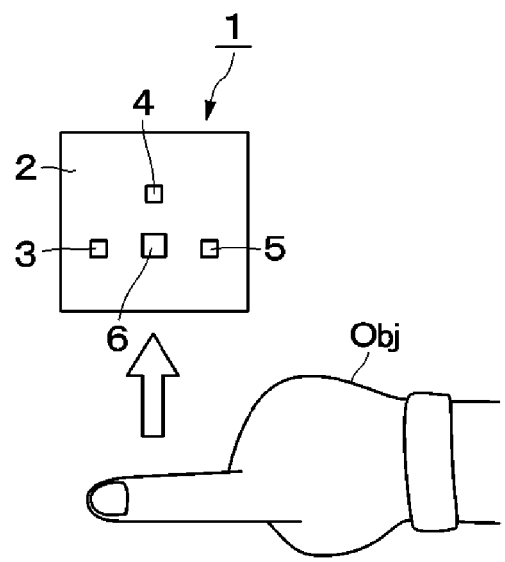
FIG. 15 is an explanatory diagram showing a state where the detection object is moved in a Y-axis direction.
Figure 16:
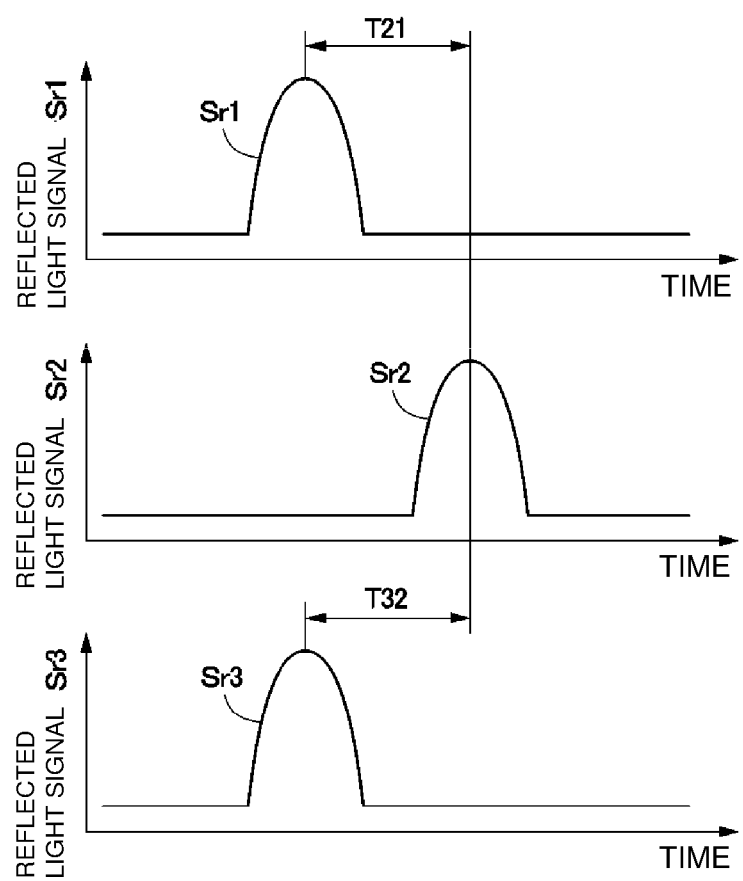
FIG. 16 is a characteristic diagram showing temporal changes of reflected light signals when the detection object is moved in the Y-axis direction.

On the other hand, as shown in FIGS. 15 and 16, when the detection object Obj moves along the Y-axis direction, the detection object Obj passes through above the light emitting elements 5, 3, and 4 in this order. At that time, the phase differences T21 and T32 also become values corresponding to such an order of passing. Thus, it is possible to detect movement of the detection object Obj along the Y-axis direction and the movement speed of the detection object Obj on the basis of the phase differences T21 and T32.

Figure 17:
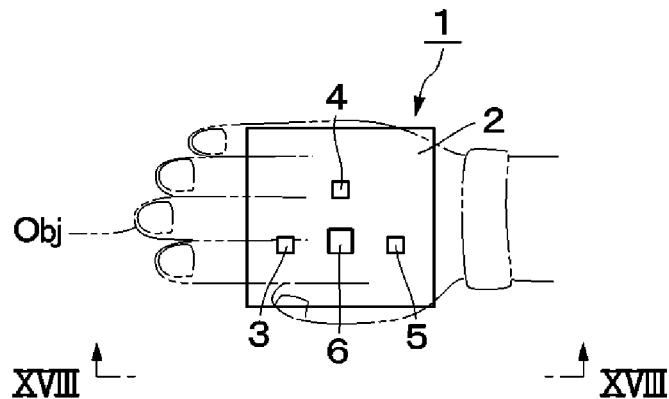
FIG. 17 is an explanatory diagram showing a state where the detection object covers above the optical sensor.
Figure 18:
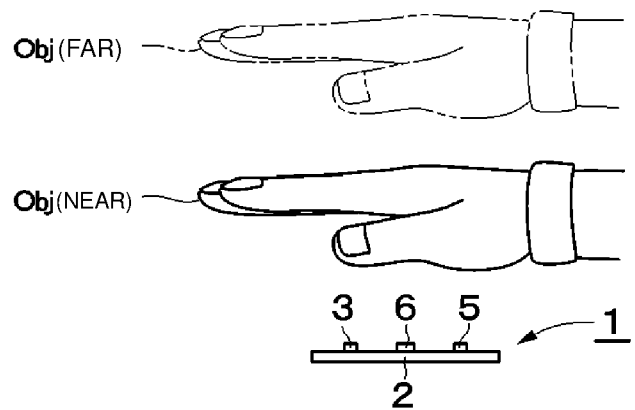
FIG. 18 is an explanatory diagram as viewed from an arrow XVIII-XVIII direction in FIG. 17.
Figure 19:
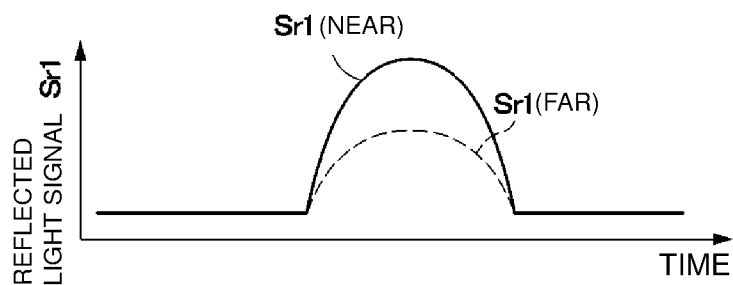
FIG. 19 is a characteristic diagram showing a temporal change of a reflected light signal when the detection object passes through above the optical sensor.

In addition, the magnitudes of the reflected light signals Sr1 to Sr3 change in response to the position of the detection object Obj in the Z-axis direction as shown in FIGS. 17 to 19. In other words, when the detection object Obj is located near the optical sensor 1, the reflected light becomes strong, and the reflected light signals Sr1 to Sr3 are also increased. On the other hand, when the detection object Obj is located away from the optical sensor 1, the reflected light becomes weak, and the reflected light signals Sr1 to Sr3 are also decreased. Thus, it is possible to detect the position in the Z-axis direction in accordance with the magnitudes of the reflected light signals Sr1 to Sr3, and it is possible to detect movement of the detection object Obj along the Z-axis direction and the movement speed of the detection object Obj in accordance with changes in the magnitudes of the reflected light signals Sr1 to Sr3.

Figure 20:
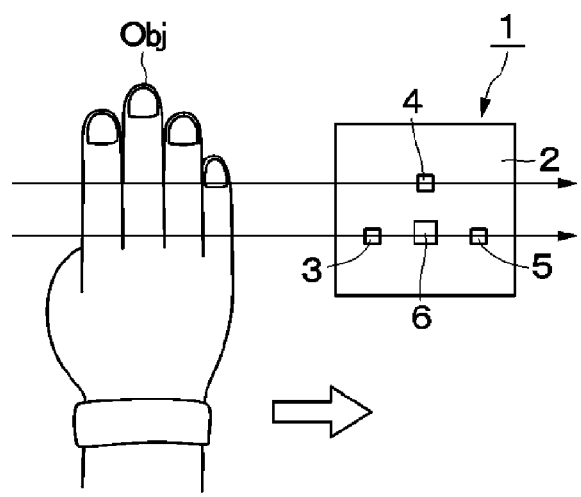
FIG. 20 is an explanatory diagram showing a state where the number of fingers blocking light from each of three light emitting elements is the same when a hand is moved in the X-axis direction.
Figure 21:
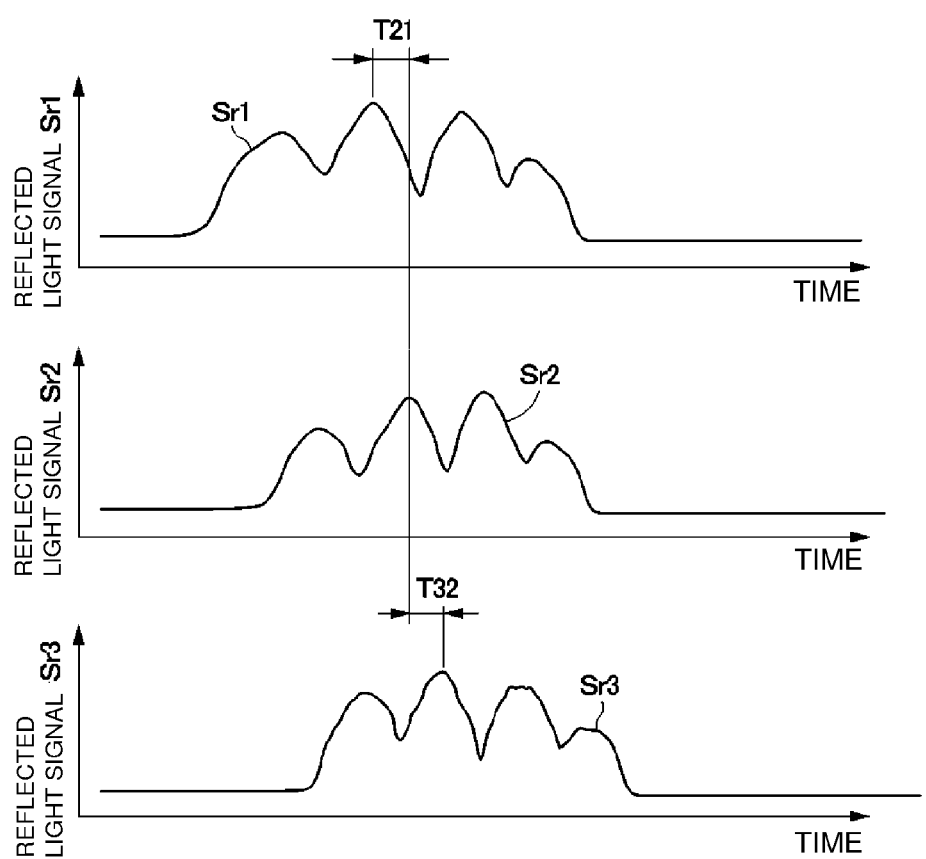
FIG. 21 is a characteristic diagram showing temporal changes of reflected light signals corresponding to FIG. 20.

Moreover, when an element having high resolution such as a VCSEL is used as each of the light emitting elements 3 to 5, the magnitudes of the reflected light signals Sr1 to Sr3 change in response to irregularities of the surface of the detection object Obj. Thus, as shown in FIGS. 20 and 21, for example, when a hand as the detection object Obj moves along the X-axis direction, the magnitudes of the reflected light signals Sr1 to Sr3 change in response to irregularities such as fingers, so that a plurality of peaks occur in the reflected light signals Sr1 to Sr3.

Figure 22:
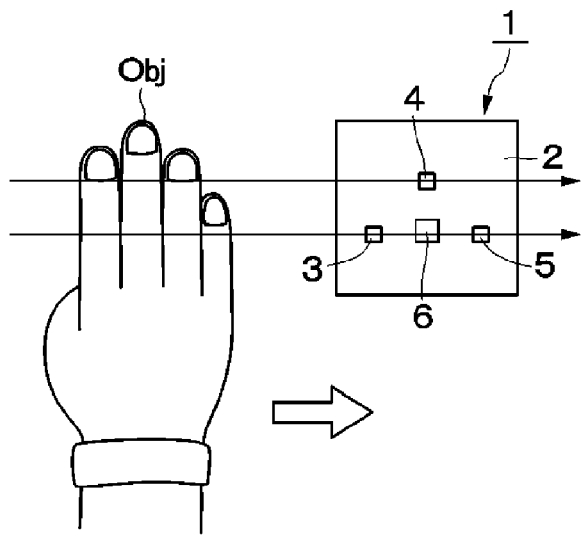
FIG. 22 is an explanatory diagram showing a state where the number of fingers blocking light from each of the three light emitting elements is different from those from the other light emitting elements when a hand is moved in the X-axis direction.
Figure 23:
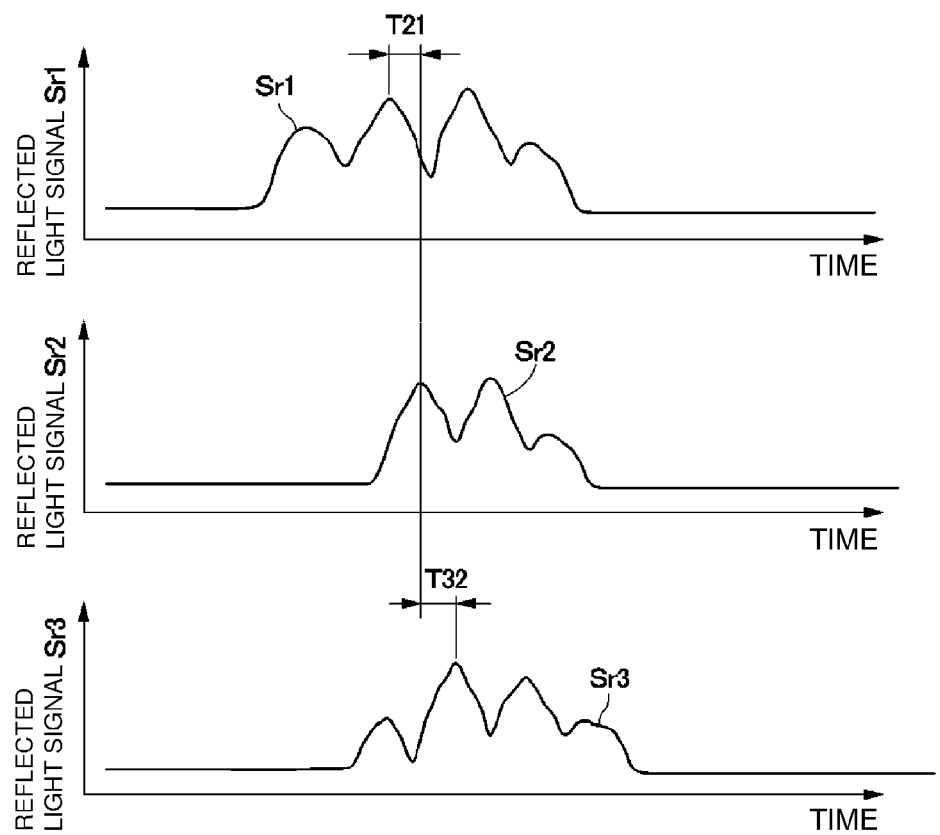
FIG. 23 is a characteristic diagram showing temporal changes of reflected light signals corresponding to FIG. 22.

On the other hand, as shown in FIG. 22, for example, when a hand is used as the detection object Obj, the shapes of portions irradiated with the light from the light emitting elements 3 to 5 may be different for each of the light emitting elements 3 to 5. In an example shown in FIG. 22, the light from the light emitting elements 3 and 5 is applied to four fingers, that is, the index finger, the middle finger, the ring finger, and the little finger. The light from the light emitting element 4 is applied to only the three fingers, except for the little finger. In this case, as shown in FIG. 23, the reflected light signals Sr1 and Sr3 are different from the reflected light signal Sr2 in number of peaks. Thus, when the peaks, rising, falling, or the like of the reflected light signals Sr1 to Sr3 is used, it may be impossible to obtain precise phase differences T21 and T32.

Figure 24:
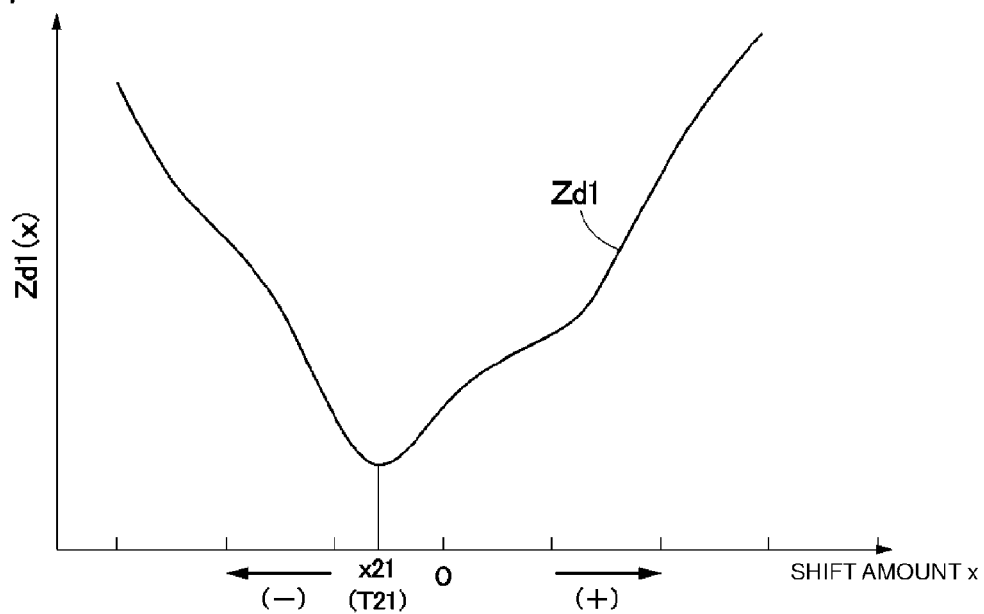
FIG. 24 is a characteristic diagram showing a relationship between a square sum of the difference between reflected light signals Sr1 and Sr2 and a shift amount.
Figure 25:
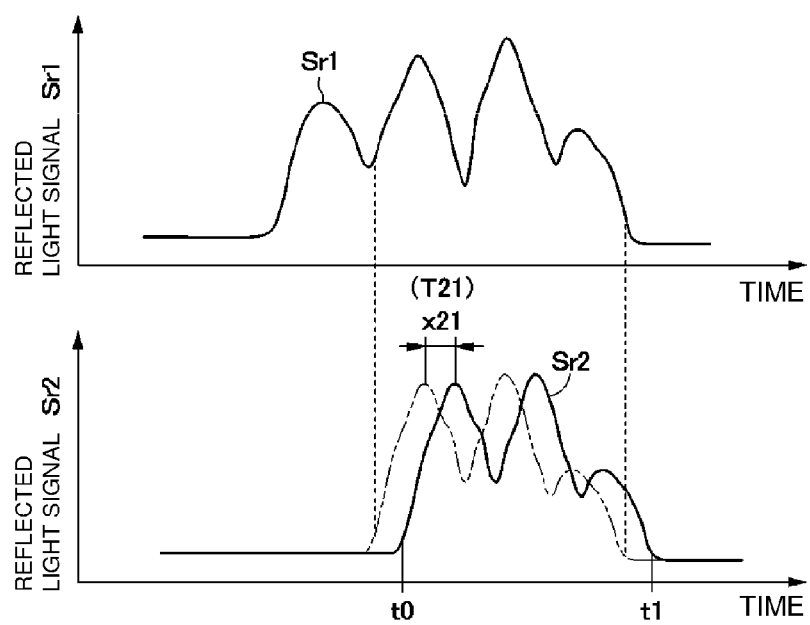
FIG. 25 is a characteristic diagram showing temporal changes of the reflected light signals Sr1 and Sr2.

In contrast, in the optical sensor 1 according to the first embodiment, the phase differences T21 and T32 are obtained on the basis of the differences among the entire waveforms of the reflected light signals Sr1 to Sr3. For example, with regard to the reflected light signals Sr1 to Sr3 shown in FIG. 23, the relationship between the shift amount x and the function Zd1(x) of the square sum of the difference between the reflected light signals Sr1 and Sr2 is as shown in FIG. 24. In this case, the function Zd1(x) has only one minimum value, and thus the shift amount x21 corresponding to the minimum value is detected as the phase difference T21. When the reflected light signal Sr2 is shifted by the shift amount x21 as shown by an alternate long and two short dashes line in FIG. 25, it is recognized that the waveforms of the reflected light signals Sr1 and Sr2 correspond to each other.

Figure 26:
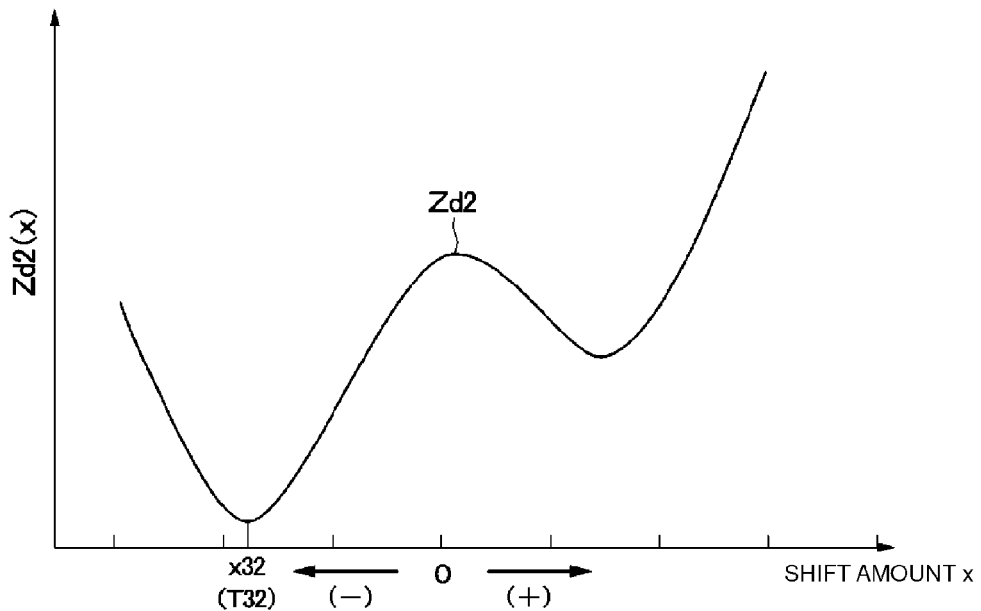
FIG. 26 is a characteristic diagram showing a relationship between a square sum of the difference between the reflected light signals Sr2 and Sr3 and a shift amount.
Figure 27:
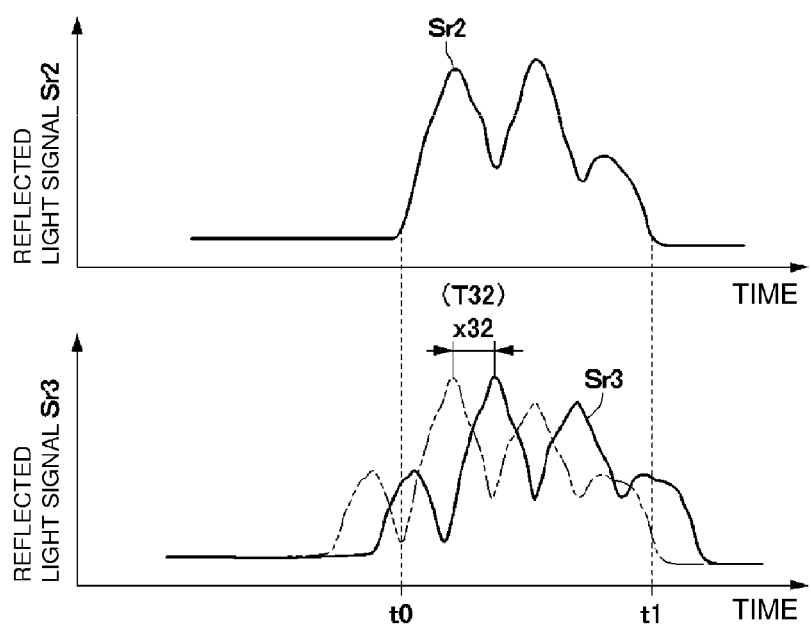
FIG. 27 is a characteristic diagram showing temporal changes of the reflected light signals Sr2 and Sr3.

Meanwhile, the relationship between the shift amount x and the function Zd2(x) of the square sum of the difference between the reflected light signals Sr2 and Sr3 is as shown in FIG. 26. In this case, the function Zd2(x) has two minimum values, but the shift amount x32 corresponding to the smallest minimum value among them is detected as the phase difference T32. When the reflected light signal Sr3 is shifted by the shift amount x32 as shown by an alternate long and two short dashes line in FIG. 27, it is recognized that the waveforms of the reflected light signals Sr2 and Sr3 correspond to each other. It should be noted that the shift amount x corresponding to the other minimum value corresponds to a position shifted by one finger.

As described above, in the first embodiment, even when the waveforms of the reflected light signals Sr1 to Sr3 are different from each other, it is possible to obtain precise phase differences T21 and T32. As a result, it is possible to accurately detect also a movement direction inclined obliquely relative to the X-axis direction and the Y-axis direction, in addition to the X-axis direction and the Y-axis direction.

Figure 7:
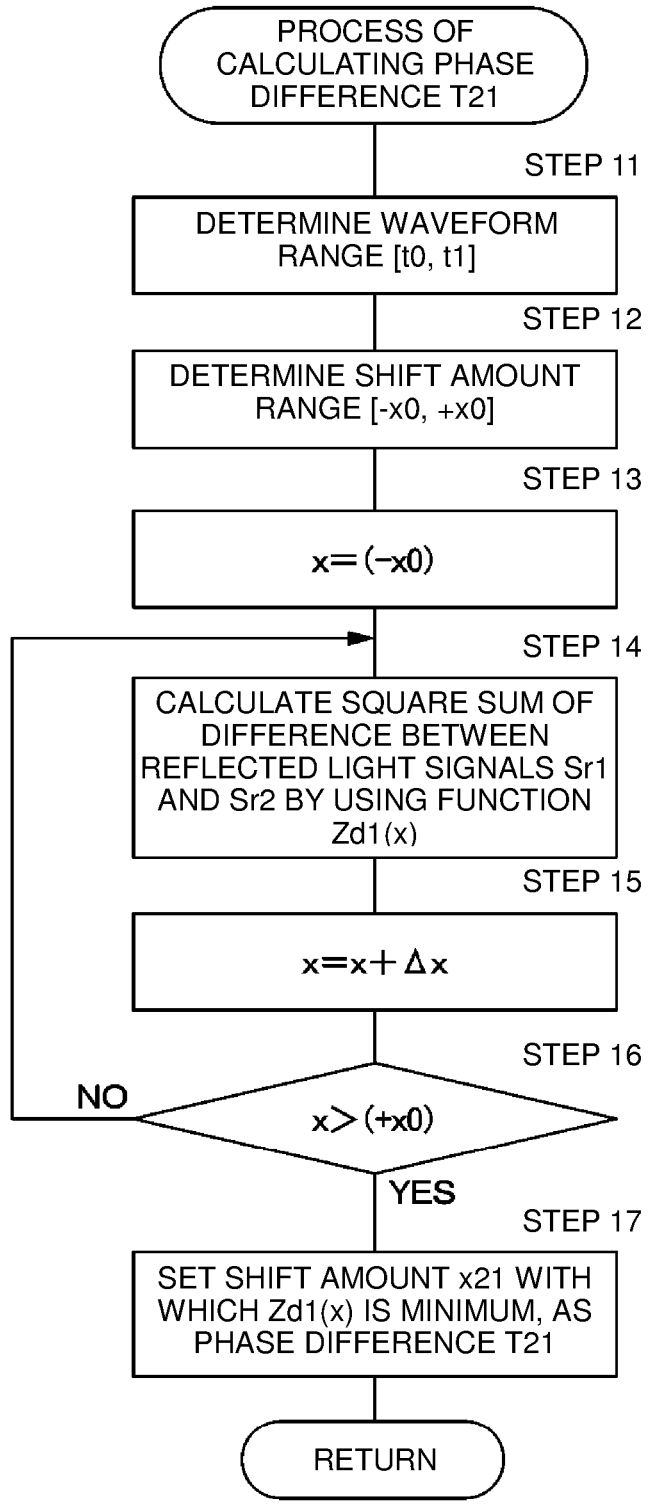
FIG. 7 is a flowchart showing a process of calculating a phase difference T21 in FIG. 6.
Figure 8:
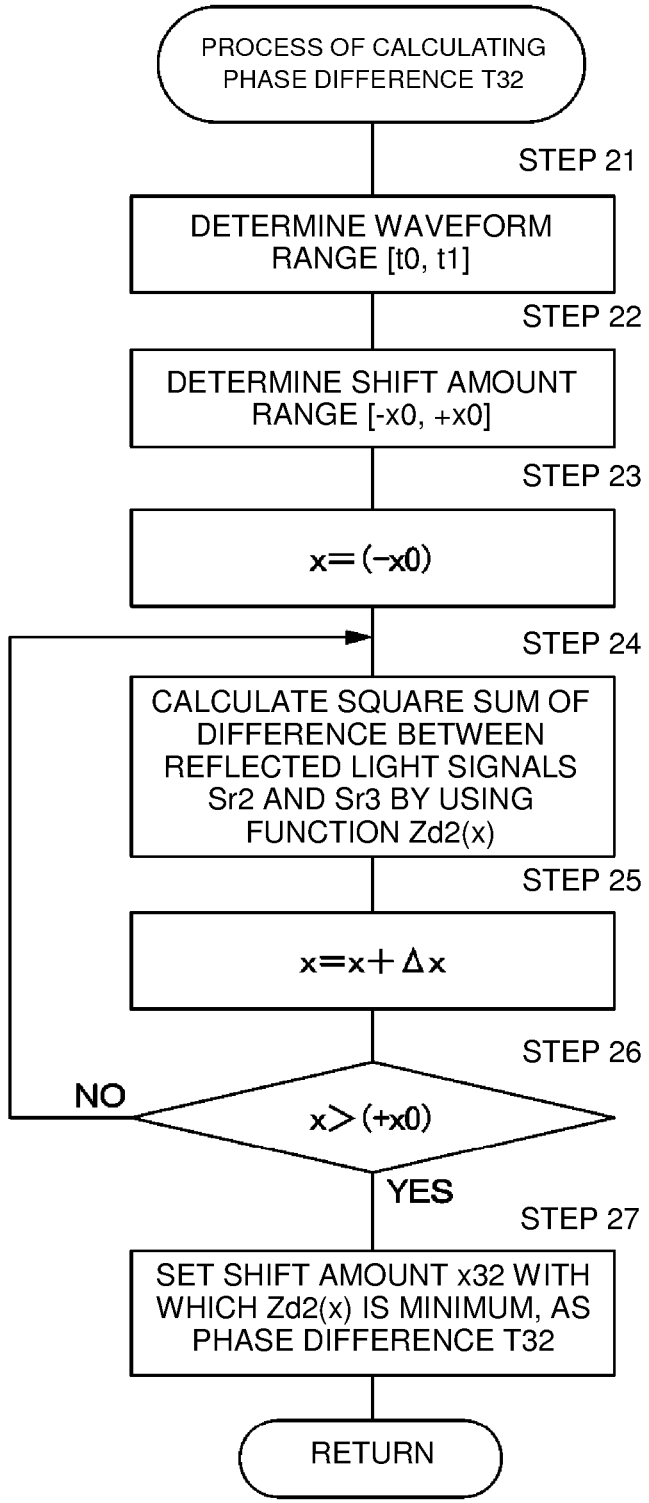
FIG. 8 is a flowchart showing a process of calculating a phase difference T32 in FIG. 6.
Figure 9:
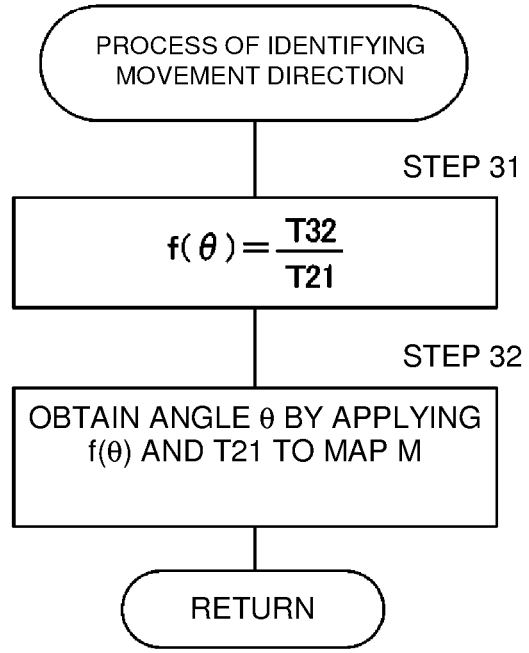
FIG. 9 is a flowchart showing a process of identifying a movement direction in FIG. 6.

It should be noted that steps 1 and 2 in FIG. 6 indicate a specific example of a reflected light signal obtaining unit; steps 3 and 4 in FIG. 6, steps 13 to 17 in FIG. 7, and steps 23 to 27 in FIG. 8 indicate a specific example of a phase difference calculator; and step 5 in FIG. 6 indicates a specific example of a movement direction identifying unit.

Figure 28:
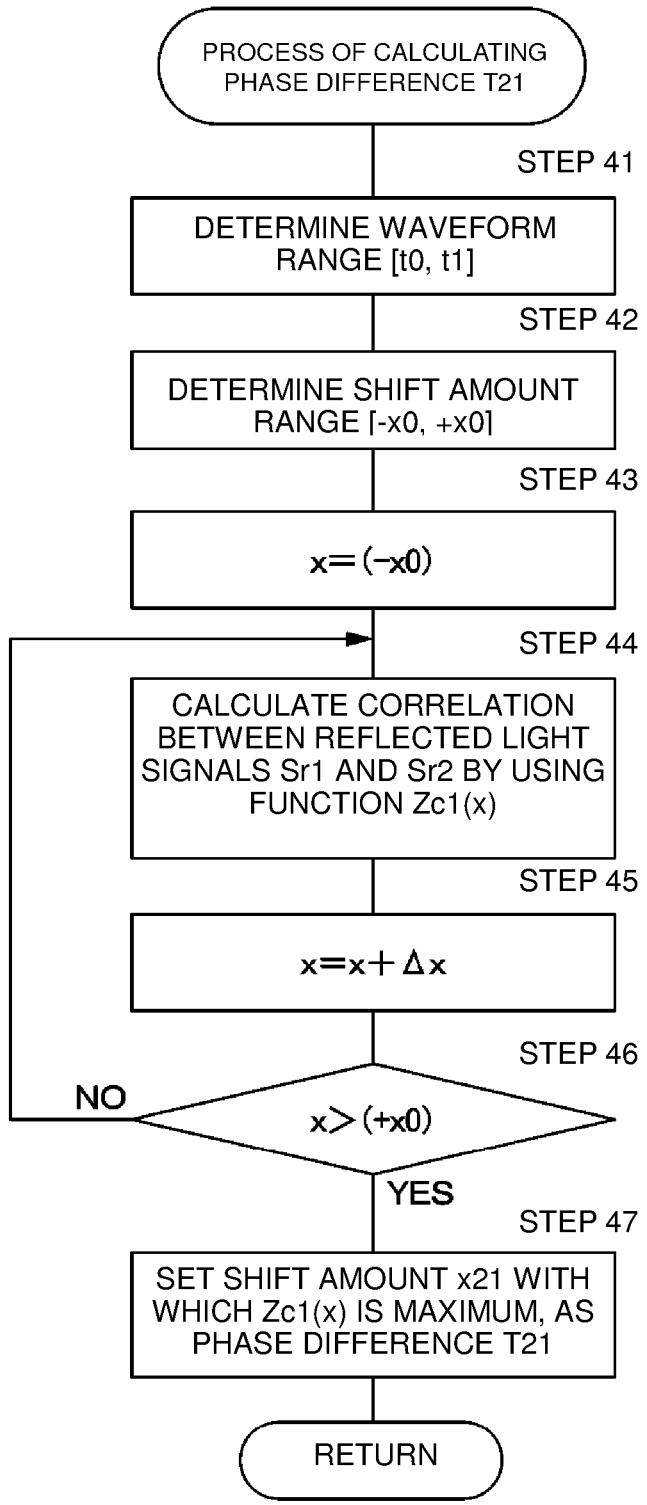
FIG. 28 is a flowchart showing a process of calculating the phase difference T21 according to the second embodiment.
Figure 29:
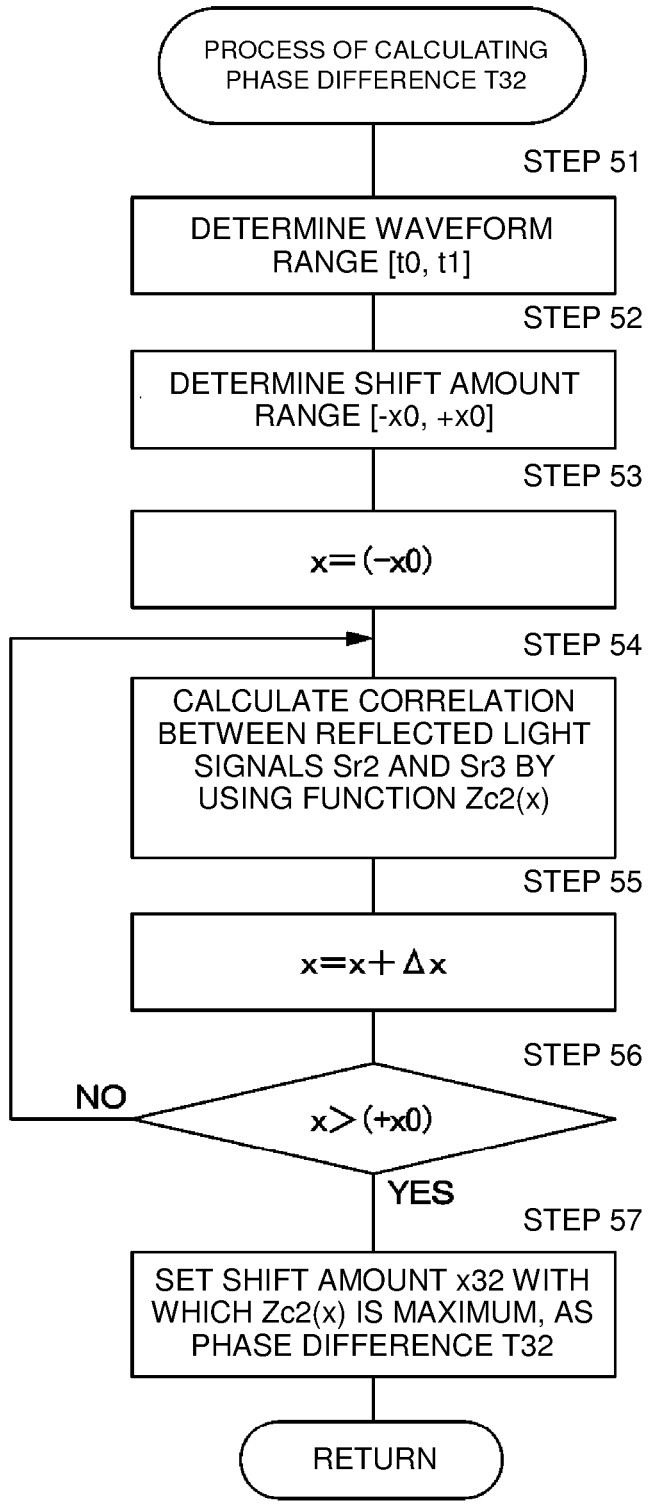
FIG. 29 is a flowchart showing a process of calculating the phase difference T32 according to the second embodiment.

Next, a second embodiment of the present invention will be described with reference to FIGS. 4, 28, and 29. In the second embodiment, phase differences are obtained on the basis of mutual correlations among three reflected light signals. It should be noted that in the second embodiment, the same components as those in the first embodiment are designated by the same reference signs and the description thereof is omitted.

An optical sensor 21 according to the second embodiment has substantially the same configuration as the optical sensor 1 according to the first embodiment. Thus, the three light emitting elements 3 to 5 and the light receiving element 6 are provided on the substrate 2, and a signal processing circuit 22 is mounted on the substrate 2. The signal processing circuit 22 has substantially the same configuration as the signal processing circuit 11 according to the first embodiment, and includes the light emitting element driving portion 12, the light detection signal amplification portion 13, the filter portion 14, and the arithmetic processing portion 15.

Similarly to the first embodiment, the arithmetic processing portion 15 according to the second embodiment executes the program shown in FIG. 6, to identify the movement direction of the detection object Obj. In steps 3 and 4 in FIG. 6, the arithmetic processing portion 15 according to the second embodiment obtains the phase differences T21 and T32 on the basis of the mutual correlations among the reflected light signals Sr1 to Sr3.

Next, a process of calculating the phase difference T21 according to the second embodiment will be described with reference to FIG. 28.

In step 41, a start time t0 and an end time t1 of the waveform are determined as a range for calculating the correlation between the waveforms, on the basis of the reflected light signals Sr1 and Sr2. In step 42, the maximum value (±x0) by which the waveform of the reflected light signal Sr2 is to be shifted to the negative side or the positive side is determined as a detection range of the phase difference T21 on the basis of the reflected light signals Sr1 and Sr2.

In step 43, a shift amount x is set at a negative maximum value (−x0) as an initial value. In step 44, the reflected light signal Sr2 is temporally shifted by the shift amount x using a function Zc1(x) shown in the following mathematical formula 5, and a product sum of the reflected light signals Sr1 and Sr2 is calculated in this state. In this case, the function Zc1(x) is a correlation function of the reflected light signals Sr1 and Sr2. It should be noted that the function Zc1(x) calculates the sum of discrete values, but the integral of a continuous value may be calculated.

$$Zc1(x) = \sum_{t=t0}^{t1} Sr1(t) \times Sr2(x+t) \qquad \text{[Math. 5]}$$

In subsequent step 45, the shift amount x is increased by a predetermined value Δx (Δx>0), and in step 46, it is determined whether the shift amount x is larger than a positive maximum value (+x0). Then, if it is determined as "NO" in step 46, the processes in steps 44 and 45 are repeated. On the other hand, if it is determined as "YES" in step 46, the process proceeds to step 47, and a shift amount x21 with which the function Zc1(x) is maximum is outputted as the phase difference T21.

Next, a process of calculating the phase difference T32 according to the second embodiment will be described with reference FIG. 29.

In step 51, a start time t0 and an end time t1 of the waveform are determined as a range for calculating the correlation between the waveforms, on the basis of the reflected light signals Sr2 and Sr3. In step 52, a maximum value (±x0) by which the waveform of the reflected light signal Sr2 is to be shifted to the negative side or the positive side is determined as a detection range of the phase difference T32 on the basis of the reflected light signals Sr2 and Sr3.

In step 53, the shift amount x is set at a negative maximum value (−x0) as an initial value. In step 54, the reflected light signal Sr3 is temporally shifted by the shift amount x using a function Zc2(x) shown in the following mathematical formula 6, and a product sum of the reflected light signals Sr2 and Sr3 is calculated in this state. In this case, the function Zc2(x) is a correlation function of the reflected light signals Sr2 and Sr3. It should be noted that the function Zc2(x) calculates the sum of discrete values, but the integral of a continuous value may be calculated.

$$Zc2(x) = \sum_{t=t0}^{t1} Sr2(t) \times Sr3(x+t) \qquad \text{[Math. 6]}$$

In subsequent step 55, the shift amount x is increased by a predetermined value Δx (Δx>0), and in step 56, it is determined whether the shift amount x is larger than a positive maximum value (+x0). Then, if it is determined as "NO" in step 56, the processes in steps 54 and 55 are repeated. On the other hand, if it is determined as "YES" in step 56, the process proceeds to step 57, and a shift amount x32 with which the function Zc2(x) is maximum is outputted as the phase difference T32.

Thus, in the second embodiment as well, it is possible to obtain substantially the same advantageous effects as those in the first embodiment. It should be noted that in the second embodiment, steps 43 to 47 in FIG. 28 and steps 53 to 57 in FIG. 29 indicate a specific example of the phase difference calculator.

Figure 30:
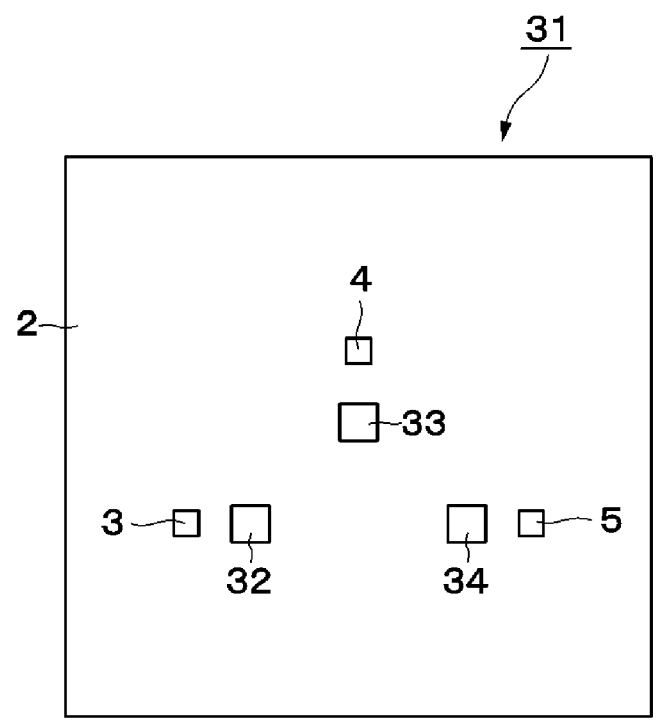
FIG. 30 is a plan view schematically showing an optical sensor according to a third embodiment, in which a transparent resin layer is omitted.

Next, a third embodiment of the present invention will be described with reference to FIG. 30. In the third embodiment, three light receiving elements are provided corresponding to three light emitting elements. It should be noted that in the third embodiment, the same components as those in the first embodiment are designated by the same reference signs and the description thereof is omitted.

In an optical sensor 31 according to the third embodiment, three light receiving elements 32 to 34 are mounted on the substrate 2. The light receiving element 32 is located near the light emitting element 3 and receives the reflected light based on the light from the light emitting element 3. The light receiving element 33 is located near the light emitting element 4 and receives the reflected light based on the light from the light emitting element 4. The light receiving element 34 is located near the light emitting element 5 and receives the reflected light based on the light from the light emitting element 5.

In this case, the light emitting elements 3 to 5 do not need to emit light by pulse emission in a time-division manner, and may continuously emit light.

Thus, in the third embodiment as well, it is possible to obtain substantially the same advantageous effects as those in the first embodiment. In this case, light detection signals outputted from the three light receiving elements 32 to 34 correspond to the reflected light signals Sr1 to Sr3, respectively, and thus the three light receiving elements 32 to 34 form a part of the reflected light signal obtaining unit.

The third embodiment is also applicable to the second embodiment. In addition, in the third embodiment, the case of including the three light receiving elements 32 to 34 has been described as an example, but two light receiving elements may be provided, or four or more light receiving elements may be provided.

In each embodiment described above, the case of including the three light emitting elements 3 to 5 has been described as an example, but four or more light emitting elements may be provided.

In each embodiment described above, the signal processing circuit 11 or 22 is mounted on the substrate 2, but may be provided independently of the substrate 2.

In each embodiment described above, the case where the movement direction or the like of the detection object Obj is identified by using the phase difference T21 between the reflected light signals Sr1 and Sr2 and the phase difference T32 between the reflected light signals Sr2 and Sr3 has been described as an example. However, the present invention is not limited thereto. For example, a phase difference T31 between the reflected light signals Sr1 and Sr3 may be used instead of either one of the phase differences T21 and T32, or these three phase differences T21, T32, and T31 may be used.

REFERENCE SIGNS LIST 1, 21, 31 optical sensor
2 substrate
2A surface
3 to 5 light emitting element
6, 32 to 34 light receiving element
11, 22 signal processing circuit
12 light emitting element driving portion (light emission controller)
15 arithmetic processing portion

The invention claimed is:

1. An optical sensor comprising:
a substrate;
first, second and third light emitting elements disposed on the substrate;
a light emission controller configured to control the first, second and third light emitting elements;
at least one light receiving element disposed on the substrate and configured to receive reflected light that is emitted from the first, second and third light emitting elements and reflected from a detection object; and
a microprocessor configured to:
obtain first, second and third reflected light signals corresponding to the reflected light received by the at least one light receiving element from respective ones of the first, second and third light emitting elements;
calculate a first phase difference between the first and second reflected light signals by calculating a squared sum of the difference in the magnitude of the first and second reflected light signals along a predetermined portion of the waveforms of the first and second reflected light signals for each of a plurality of shifts in the phase of the first and second reflected light signals relative to one another and determining the first phase difference as a function of which of the squared sums is the smallest;
calculate a second phase difference between the second and third reflected light signals by calculating a squared sum of the difference in the magnitude of the second and third reflected light signals along a predetermined portion of the waveforms of the second and third reflected light signals for each of a plurality of shifts in the phase of the second and third reflected light signals relative to one another and determining the second phase difference as a function of which of the squared sums is the smallest; and
determine a movement direction of the detection object based on at least the first and second phase differences.

2. The optical sensor according to claim 1, wherein the light emission controller controls each of the first, second and third light emitting elements to emit light by pulse emission in a time-division manner.

3. The optical sensor according to claim 1, wherein each of the light emitting elements is a vertical cavity surface emitting laser.

4. An optical sensor comprising:
a substrate;
at least first, second and third light emitting elements disposed on the substrate;
a light emission controller configured to control the first, second and third light emitting elements;
at least one light receiving element disposed on the substrate and configured to receive reflected light that is emitted from the first, second and third light emitting elements and reflected from a detection object; and
a microprocessor configured to:
obtain first, second and third reflected light signals corresponding to the reflected light received by the at least one light receiving element from respective ones of the first, second and third light emitting elements;
calculate a first phase difference between the first and second reflected light signals by calculating a product sum of the difference in the magnitude of the first and second reflected light signals along a predetermined portion of the waveforms of the first and second reflected light signals for each of a plurality of shifts in the phase of the first and second reflected light signals relative to one another and determining the first phase difference as a function of which of the product sums is the largest;
calculate a second phase difference between the second and third reflected light signals by calculating a product sum of the difference in the magnitude of the second and third reflected light signals along a predetermined portion of the waveforms of the second and third reflected light signals for each of a plurality of shifts in the phase of the second and third reflected light signals relative to one another and determining the second phase difference as a function of which of the product sums is largest; and
determine a movement direction of the detection object based on at least the first and second phase differences.

5. An optical sensor comprising:
a substrate;
first, second and third light emitting elements disposed on the substrate;
a light emission controller configured to control the first, second and third light emitting elements;
at least one light receiving element disposed on the substrate and configured to receive reflected light that is emitted from the first, second and third light emitting elements and reflected from a detection object; and
a microprocessor configured to:
obtain first, second and third reflected light signals corresponding to the reflected light received by the at least one light receiving element from respective ones of the first, second and third light emitting elements;
calculate a first phase difference between the first and second reflected light signals and a second phase difference between the second and third reflected light signals; and
determine a movement direction of the detection object based on at least the first and second phase differences.

6. The optical sensor according to claim 5, wherein the microprocessor is further to determine the movement direction of the detection object based on a ratio of the first phase difference to the second phase difference.

7. An optical sensor comprising:
a substrate;
first, second and third light emitting elements disposed on the substrate;
a light emission controller configured to control the first, second and third light emitting elements;
first, second and third light receiving elements disposed on the substrate adjacent to respective ones of the first, second and third light emitting elements, each of the light receiving elements configured to receive reflected light that is emitted from the adjacent light emitting element and reflected from a detection object; and a microprocessor configured to:
obtain first, second and third reflected light signals corresponding to the reflected light received by respective ones of the first, second and third light receiving elements from the first, second and third light emitting elements;
calculate a first phase difference between the first and second reflected light signals by calculating a squared sum of the difference in the magnitude of the first and second reflected light signals along a predetermined portion of the waveforms of the first and second reflected light signals for each of a plurality of shifts in the phase of the first and second reflected light signals relative to one another and determining the first phase difference as a function of which of the squared sums is the smallest;
calculate a second phase difference between the second and third reflected light signals by calculating a squared sum of the difference in the magnitude of the second and third reflected light signals along a predetermined portion of the waveforms of the second and third reflected light signals for each of a plurality of shifts in the phase of the second and third reflected light signals relative to one another and determining the second phase difference as a function of which of the squared sums is the smallest; and
determine a movement direction of the detection object based on at least the first and second phase differences.

8. An optical sensor comprising:
a substrate;
first, second and third light emitting elements disposed on the substrate;
a light emission controller configured to control the first, second and third light emitting elements;
first, second and third light receiving elements disposed on the substrate adjacent to respective ones of the first, second and third light emitting elements, each of the light receiving elements configured to receive reflected light that is emitted from the adjacent light emitting element and reflected from a detection object; and
a microprocessor configured to:
obtain first, second and third reflected light signals corresponding to the reflected light received by the first, second and third light receiving elements from respective ones of the first, second and third light emitting elements;
calculate a first phase difference between the first and second reflected light signals by calculating a product sum of the difference in the magnitude of the first and second reflected light signals along a predetermined portion of the waveforms of the first and second reflected light signals for each of a plurality of shifts in the phase of the first and second reflected light signals relative to one another and determining the first phase difference as a function of which of the product sums is the largest;
calculate a second phase difference between the second and third reflected light signals by calculating a product sum of the difference in the magnitude of the second and third reflected light signals along a predetermined portion of the waveforms of the second and third reflected light signals for each of a plurality of shifts in the phase of the second and third reflected light signals relative to one another and determining the second phase difference as a function of which of the product sums is largest; and
determine a movement direction of the detection object based on at least the first and second phase differences.

9. The optical sensor according to claim 7, wherein the light emission controller controls each of the first, second and third light emitting elements to continuously emit light.

10. The optical sensor according to claim 7, wherein each of the light emitting elements is a vertical cavity surface emitting laser.

11. An optical sensor comprising:
a substrate;
first, second and third light emitting elements disposed on the substrate;
a light emission controller configured to control the first, second and third light emitting elements;
first, second and third light receiving elements disposed on the substrate adjacent to respective ones of the first, second and third light emitting elements, each of the light receiving elements configured to receive reflected light that is emitted from the adjacent light emitting element and reflected from a detection object; and
a microprocessor configured to:
obtain first, second and third reflected light signals corresponding to the reflected light received by the at least first, second and third light receiving elements from respective ones of the first, second and third light emitting elements;
calculate a first phase difference between the first and second reflected light signals and a second phase difference between the second and third reflected light signals; and
determine a movement direction of the detection object based on at least two of the first and second phase differences.

12. The optical sensor according to claim 11, wherein the microprocessor is further to determine the movement direction of the detection object based on a ratio of the first phase difference to the second phase difference.

13. A method for determining a movement direction of a detection object, the method comprising:
emitting light from first, second and third light emitting elements disposed on a substrate;
receiving, by at least one light receiving element disposed on the substrate, reflected light that is emitted from the first, second and third light emitting elements and reflected from the detection object;
obtaining first, second and third reflected light signals corresponding to the reflected light received by the at least one light receiving element from respective ones of the first, second and third light emitting elements;
calculating a first phase difference between the first and second reflected light signals by calculating a squared sum of the difference in the magnitude of the first and second reflected light signals along a predetermined portion of the waveforms of the first and second reflected light signals for each of a plurality of shifts in the phase of the first and second reflected light signals relative to one another and determining the first phase difference as a function of which of the squared sums is the smallest;
calculating a second phase difference between the second and third reflected light signals by calculating a squared sum of the difference in the magnitude of the second and third reflected light signals along a predetermined portion of the waveforms of the second and third reflected light signals for each of a plurality of shifts in the phase of the second and third reflected light signals relative to one another and determining the second phase difference as a function of which of the squared sums is the smallest; and determining the movement direction of the detection object based on at least two of the first and second phase differences.

14. A method for determining a movement direction of a detection object, the method comprising:

emitting light from first, second and third light emitting elements disposed on a substrate;

receiving, by at least one light receiving element disposed on the substrate, reflected light that is emitted from the first, second and third light emitting elements and reflected from the detection object;

obtaining first, second and third reflected light signals corresponding to the reflected light received by the at least one light receiving element from respective ones of the first, second and third light emitting elements;

calculating a first phase difference between the first and second reflected light signals by calculating a product sum of the difference in the magnitude of the first and second reflected light signals along a predetermined portion of the waveforms of the first and second reflected light signals for each of a plurality of shifts in the phase of the first and second reflected light signals relative to one another and determining the first phase difference as a function of which of the product sums is the largest;

calculating a second phase difference between the second and third reflected light signals by calculating a product sum of the difference in the magnitude of the second and third reflected light signals along a predetermined portion of the waveforms of the second and third reflected light signals for each of a plurality of shifts in the phase of the second and third reflected light signals relative to one another and determining the second phase difference as a function of which of the product sums is largest; and determining the movement direction of the detection object based on at least the first and second phase differences.

15. A method for determining a movement direction of a detection object, the method comprising:

emitting light from first, second and third light emitting elements disposed on a substrate;

receiving, by at least one light receiving element disposed on the substrate, reflected light that is emitted from respective ones of the first, second and third light emitting elements and reflected from the detection object;

obtaining first, second and third reflected light signals corresponding to the reflected light received by the at least one light receiving element from respective ones of the first, second and third light emitting elements;

calculating a first phase difference between the first and second reflected light signals and a second phase difference between the second and third reflected light signals; and determining the movement direction of the detection object based on at least the first and second phase differences.

16. The method according to claim 15, further comprising determining the movement direction of the detection object based on a ratio of the first phase difference to the second phase difference.

* * * * *